(12) United States Patent
Kang et al.

(10) Patent No.: US 11,815,771 B2
(45) Date of Patent: Nov. 14, 2023

(54) DISPLAY PANEL AND MANUFACTURING METHOD THEREOF

(71) Applicant: HannStar Display Corporation, Taipei (TW)

(72) Inventors: Mu-Kai Kang, Tainan (TW); Cheng-Yen Yeh, Taichung (TW); Sz-Kai Huang, Taichung (TW); Jing-Xuan Chen, Tainan (TW); Yen-Chung Chen, Taichung (TW)

(73) Assignee: HannStar Display Corporation, Taipei (TW)

( * ) Notice: Subject to any disclaimer, the term of this patent is extended or adjusted under 35 U.S.C. 154(b) by 0 days.

(21) Appl. No.: 17/964,921

(22) Filed: Oct. 13, 2022

(65) Prior Publication Data

US 2023/0147751 A1 May 11, 2023

(30) Foreign Application Priority Data

Nov. 5, 2021 (CN) .......................... 202111307365.5

(51) Int. Cl.
| | |
|---|---|
| *G02F 1/1362* | (2006.01) |
| *H01L 27/12* | (2006.01) |
| *G02F 1/1333* | (2006.01) |
| *G02F 1/1343* | (2006.01) |
| *G02F 1/1335* | (2006.01) |

(52) U.S. Cl.
CPC .. *G02F 1/136213* (2013.01); *G02F 1/133354* (2021.01); *G02F 1/134309* (2013.01); *G02F 1/136227* (2013.01); *G02F 1/136295* (2021.01); *H01L 27/124* (2013.01); *H01L 27/1259* (2013.01); *G02F 1/133553* (2013.01); *G02F 2201/121* (2013.01); *G02F 2201/123* (2013.01)

(58) Field of Classification Search
None
See application file for complete search history.

(56) References Cited

U.S. PATENT DOCUMENTS

| | | | |
|---|---|---|---|
| 5,745,195 A * | 4/1998 | Zhang | G02F 1/136213 349/39 |
| 6,411,346 B1 * | 6/2002 | Numano | G02F 1/136213 349/39 |

(Continued)

*Primary Examiner* — Ryan Crockett
(74) *Attorney, Agent, or Firm* — JCIPRNET

(57) ABSTRACT

A display panel includes a first substrate and multiple pixel structures. The pixel structure includes at least one active element, at least one pixel electrode, a first common electrode, and a second common electrode. The at least one pixel electrode includes a first sub-electrode, a second sub-electrode, and a third sub-electrode. The first sub-electrode is electrically connected to one of the at least one corresponding active element and the second sub-electrode. The third sub-electrode is electrically connected to the second sub-electrode. The first sub-electrode, the second sub-electrode, and the third sub-electrode are different layers. The first common electrode is disposed between the first sub-electrode and the first substrate, and overlaps the first sub-electrode. The second common electrode is disposed between the first sub-electrode and the third sub-electrode, and overlaps the first sub-electrode and the third sub-electrode. The second sub-electrode and the second common electrode are the same film layer.

18 Claims, 27 Drawing Sheets

(56) References Cited

U.S. PATENT DOCUMENTS

| | | | | |
|---|---|---|---|---|
| 7,199,396 B2* | 4/2007 | Lebrun | ............... | H01L 27/0207 |
| | | | | 257/E27.111 |
| 7,671,942 B2* | 3/2010 | Nam | ................. | G02F 1/136213 |
| | | | | 349/114 |
| 7,838,886 B2* | 11/2010 | Kim | .................... | H01L 27/1255 |
| | | | | 257/59 |
| 8,049,847 B2* | 11/2011 | Lin | .................... | G02F 1/136213 |
| | | | | 349/114 |
| 2005/0104814 A1* | 5/2005 | Choi | .................... | G09G 3/3233 |
| | | | | 257/E27.113 |
| 2011/0285610 A1* | 11/2011 | Yan | .................... | G02F 1/136213 |
| | | | | 345/55 |
| 2015/0138471 A1* | 5/2015 | Dong | ................. | G02F 1/13306 |
| | | | | 257/59 |
| 2016/0351600 A1* | 12/2016 | Moriwaki | ............ | H04N 9/3105 |
| 2019/0391426 A1* | 12/2019 | Ito | ..................... | G02F 1/136286 |
| 2020/0052008 A1* | 2/2020 | Chi | .................... | G02F 1/136213 |

\* cited by examiner

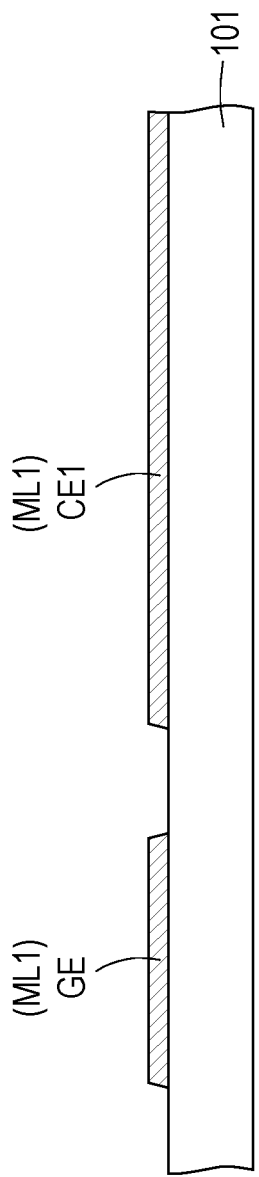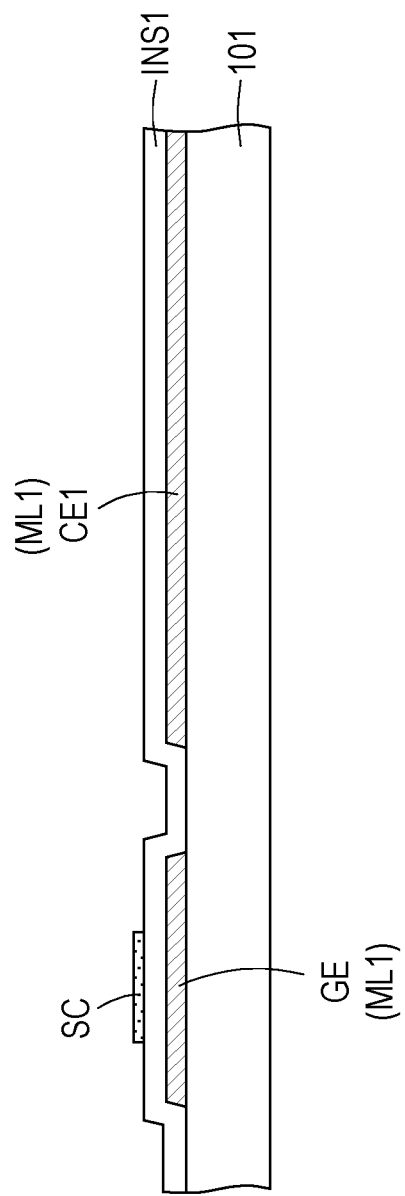

DISPLAY PANEL AND MANUFACTURING METHOD THEREOF

CROSS-REFERENCE TO RELATED APPLICATION

This application claims the priority benefit of China application serial no. 202111307365.5, filed on Nov. 5, 2021. The entirety of the above-mentioned patent application is hereby incorporated by reference herein and made a part of this specification.

BACKGROUND

Technical Field

The disclosure relates to a display technology, and more particularly, to a display panel and a manufacturing method thereof.

Description of Related Art

Nowadays, the application of display screens may be seen everywhere in life, and the liquid crystal display panel still maintains the mainstream status in the market due to the relatively sophisticated technology development and the low cost. Generally speaking, the display pixels of the liquid crystal display panel need to rely on the disposition of the storage capacitor to maintain the required driving voltage within a frame period. In recent years, the rising demand for retina displays, such as smart phones, tablets, or head-mounted display devices, has driven related manufacturers to invest a lot of resources in the development of ultra-high-resolution retina displays. However, with the continuous improvement of the screen resolution, the size of the display pixels is also continuously reduced, resulting in insufficient storage capacitance of the display pixels. When the liquid crystal display panel is operated in a low-frequency mode, the driving voltage of the display pixel is easily attenuated within one frame period and affects the display quality.

SUMMARY

The disclosure is directed to a display panel, which has better display quality when driven at a low frequency.

The disclosure is directed to a manufacturing method of a display panel, which has a relatively high degree of integration of a manufacturing process of multiple storage capacitors.

According to the embodiment of the disclosure, the display panel includes a first substrate, multiple scan lines, multiple data lines, and multiple pixel structures. The scan lines and the data lines are disposed on the first substrate, and intersect one another to define multiple pixel areas. The pixel structures are disposed in the pixel areas, and are electrically connected to the data lines and the scan lines. Each of the pixel structures includes at least one active element, at least one pixel electrode, a first common electrode, and a second common electrode. The at least one pixel electrode includes a first sub-electrode, a second sub-electrode, and a third sub-electrode. The first sub-electrode is electrically connected to a corresponding one of the at least one active element. The second sub-electrode is electrically connected to the first sub-electrode. The third sub-electrode is electrically connected to the second sub-electrode. The first sub-electrode, the second sub-electrode, and the third sub-electrode are different layers. The first common electrode is disposed between the first sub-electrode and the first substrate, and overlaps the first sub-electrode. The second common electrode is disposed between the first sub-electrode and the third sub-electrode, and overlaps the first sub-electrode and the third sub-electrode. The second sub-electrode and the second common electrode are the same film layer, and are electrically insulated from each other.

In the embodiment of the disclosure, the display panel further includes a first insulation layer disposed between the first sub-electrode and the first common electrode, and the first sub-electrode, at least a part of the first insulation layer, and the first common electrode form a first storage capacitor.

In the embodiment of the disclosure, the display panel further includes a second insulation layer disposed between the first sub-electrode and the second common electrode, and the first sub-electrode, at least a part of the second insulation layer, and the second common electrode form a second storage capacitor.

In the embodiment of the disclosure, the second insulation layer has a first opening hole overlapping the first sub-electrode. The second sub-electrode is disposed on the second insulation layer, and a part of the second sub-electrode extends into the first opening hole and covers a surface of the first sub-electrode exposed by the first opening hole.

In the embodiment of the disclosure, the display panel further includes a third insulation layer disposed between the second common electrode and the third sub-electrode, and the third sub-electrode, at least a part of the third insulation layer, and the second common electrode form a third storage capacitor.

In the embodiment of the disclosure, the third insulation layer has a second opening hole overlapping the first opening hole. The third sub-electrode is disposed on the third insulation layer, and is electrically connected to the second sub-electrode through the second opening hole.

In the display panel according to the embodiment of the disclosure, the second common electrodes of two adjacent pixel structures of the pixel structures are electrically connected to each other through a connecting line. The connecting line overlaps a part of one of the data lines disposed between the two adjacent pixel structures.

In the display panel according to the embodiment of the disclosure, the second common electrode has a first opening overlapping the second sub-electrode of the at least one pixel electrode and a second opening overlapping the at least one active element.

In the display panel according to the embodiment of the disclosure, the second common electrodes of the pixel structures are electrically connected to each other and overlap the scan lines and the data lines.

In the display panel according to the embodiment of the disclosure, the third sub-electrode of the at least one pixel electrode covers the at least one active element, one of the data lines, and one of the scan lines.

In the display panel according to the embodiment of the disclosure, the at least one pixel electrode includes a first pixel electrode, a second pixel electrode, and a third pixel electrode. The second pixel electrode and the third pixel electrode are electrically connected to each other. The at least one active element includes a first active element and a second active element. The scan lines include a first scan line and a second scan line. The first active element is electrically connected to one of the data lines, the first pixel electrode, and the first scan line. The second active element is electrically connected to the one of the data lines, the second pixel electrode, the third pixel electrode, and the second scan line.

In the display panel according to the embodiment of the disclosure, the first common electrode and the second common electrode each overlap the first pixel electrode, the second pixel electrode, and the third pixel electrode.

In the display panel according to the embodiment of the disclosure, the first common electrode and the second common electrode each include a first sub-common electrode, a second sub-common electrode, and a third sub-common electrode. The first sub-common electrode, the second sub-common electrode, and the third sub-common electrode of the first common electrode are electrically connected to one another, and respectively overlap the first sub-electrode of the first pixel electrode, the first sub-electrode of the second pixel electrode, and the first sub-electrode of the third pixel electrode. The first sub-common electrode, the second sub-common electrode, and the third sub-common electrode of the second common electrode are electrically connected to one another, and respectively overlap the first sub-electrode of the first pixel electrode, the first sub-electrode of the second pixel electrode, and the first sub-electrode of the third pixel electrode. The first sub-common electrode, the second sub-common electrode, and the third sub-common electrode of the second common electrode are electrically connected to one another, and respectively overlap the third sub-electrode of the first pixel electrode, the third sub-electrode of the second pixel electrode, and the third sub-electrode of the third pixel electrode.

In the display panel according to the embodiment of the disclosure, one of the data lines extends along a direction. The first pixel electrode is disposed between the second pixel electrode and the third pixel electrode in the direction. The first sub-common electrode of the first common electrode is disposed between the second sub-common electrode and the third sub-common electrode of the first common electrode in the direction. The first sub-common electrode of the second common electrode is disposed between the second sub-common electrode and the third sub-common electrode of the second common electrode in the direction.

In the display panel according to the embodiment of the disclosure, the first sub-electrode of the second pixel electrode is electrically connected to the first sub-electrode of the third pixel electrode through a connecting electrode, and the connecting electrode extends along the direction.

In the display panel according to the embodiment of the disclosure, the connecting electrode, the first sub-electrode of the second pixel electrode, and the first sub-electrode of the third pixel electrode are the same film layer. The connecting electrode overlaps the first sub-common electrode of the first common electrode and the first sub-common electrode of the second common electrode, and the third sub-electrode of the first pixel electrode overlaps and covers the connecting electrode.

In the display panel according to the embodiment of the disclosure, areas of the third sub-electrode of the first pixel electrode, the third sub-electrode of the second pixel electrode, and the third sub-electrode of the third pixel electrode are the same as one another.

In an embodiment of the disclosure, the display panel further includes a second substrate, a third common electrode, and a liquid crystal layer. The second substrate is disposed opposite to the first substrate. The third common electrode is disposed on a surface of the second substrate facing the first substrate. The liquid crystal layer is disposed between the third sub-electrode of the pixel electrode and the second substrate. The third sub-electrode is a reflective electrode.

According to the embodiment of the disclosure, the manufacturing method of the display panel includes the following steps. A first metal layer is formed on the first substrate. The first insulation layer is formed on the first metal layer. A second metal layer is formed on the first insulation layer. The second insulation layer is formed on the second metal layer. The first opening hole is formed in the second insulation layer. A first transparent conductive layer is formed on the second insulation layer. The third insulation layer is formed on the first transparent conductive layer. The second opening hole is formed in the third insulation layer, and a third metal layer is formed on the third insulation layer. The first metal layer includes the scan line and the first common electrode. The second metal layer includes the data line, a drain and a source of the active element, and the first sub-electrode of the pixel electrode, and the first sub-electrode overlaps the first common electrode. The first opening hole exposes a part of the first sub-electrode. The first transparent conductive layer includes the second common electrode and the second sub-electrode of the pixel electrode. The second common electrode overlaps the first sub-electrode. The second sub-electrode is electrically connected to the first sub-electrode through the first opening hole. The second opening hole exposes at least a part of the second sub-electrode. The third metal layer includes the third sub-electrode of the pixel electrode. The second common electrode overlaps the third sub-electrode, and the third sub-electrode is electrically connected to the second sub-electrode through the second opening hole.

In the embodiment of the disclosure, the manufacturing method of the display panel further includes the following step. A second transparent conductive layer is formed on the second substrate, and the second transparent conductive layer includes a third common electrode. The first substrate and the second substrate are assembled. The first substrate and the second substrate are disposed opposite to each other, and a liquid crystal layer is disposed between the first substrate and the second substrate.

Based on the above, in the display panel according to the embodiments of the disclosure, the pixel electrode of the pixel structure has the three sub-electrodes electrically connected to one another. The sub-electrodes belong to different film layers, and the two common electrodes are disposed between the sub-electrodes. The storage capacitor formed by the common electrodes and the sub-electrodes has the relatively large storage capacitance. Accordingly, a voltage holding ratio of the pixel structure may be effectively increased, thereby improving the display quality of the display panel during the low-frequency operation. On the other hand, one of the two common electrodes and one of the sub-electrodes are formed on the same film layer. Therefore, the integration with the current display panel manufacturing process is also high. In other words, without adding the additional manufacturing processes, the display panel in the disclosure may have both better display quality and cost advantages.

BRIEF DESCRIPTION OF THE DRAWINGS

FIGS. 3A to 3I are cross-sectional views of processes of a manufacturing method of the display panel of FIG. 2.

DETAILED DESCRIPTION OF DISCLOSED EMBODIMENTS

Figure 1:
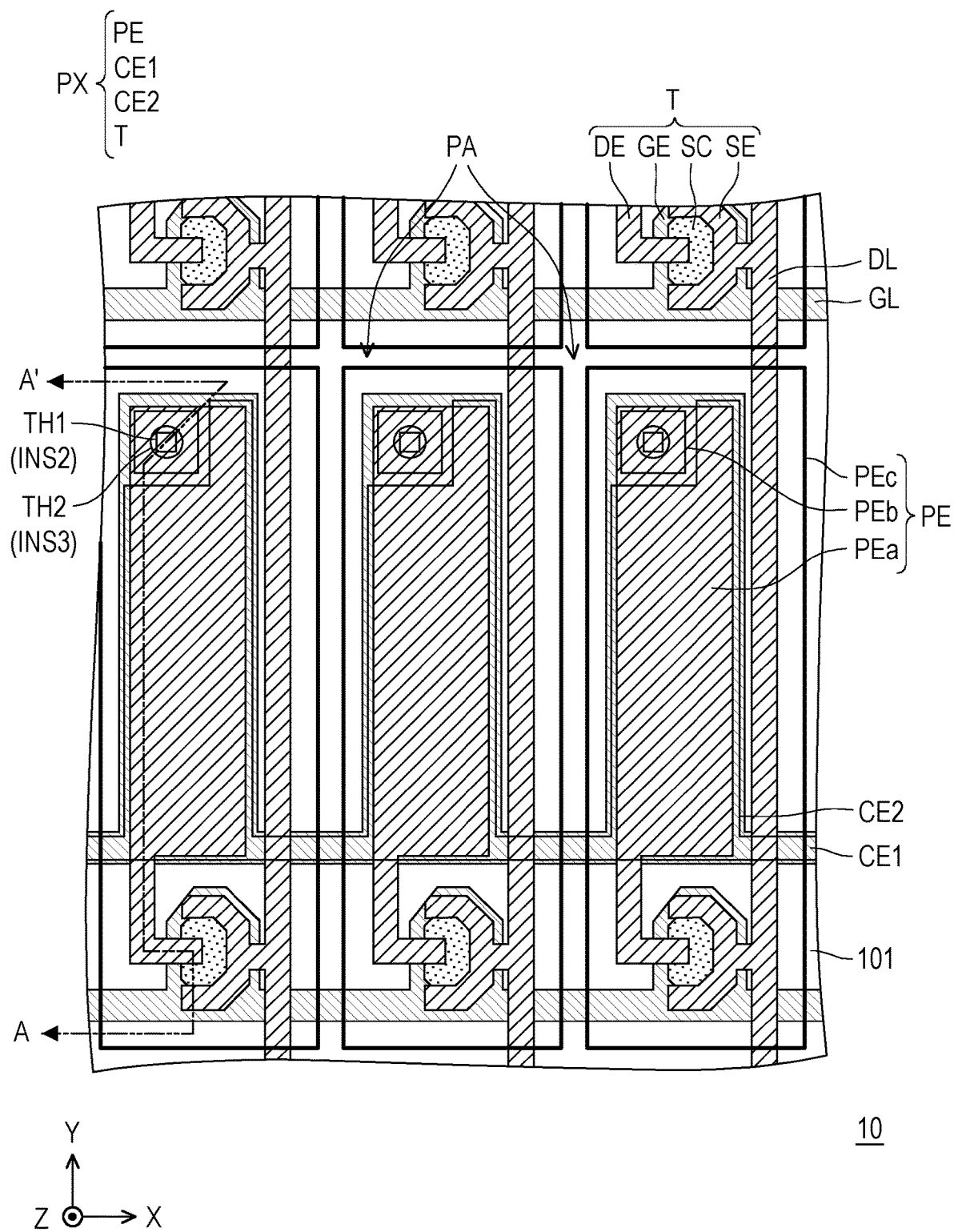
FIG. 1 is a schematic top view of a display panel according to the first embodiment of the disclosure.

Reference will now be made in detail to the exemplary embodiments of the disclosure, and examples of the exemplary embodiments are illustrated in the accompanying drawings. Whenever possible, the same reference numerals in the drawings and embodiments represent the same or similar parts.

Figure 2:
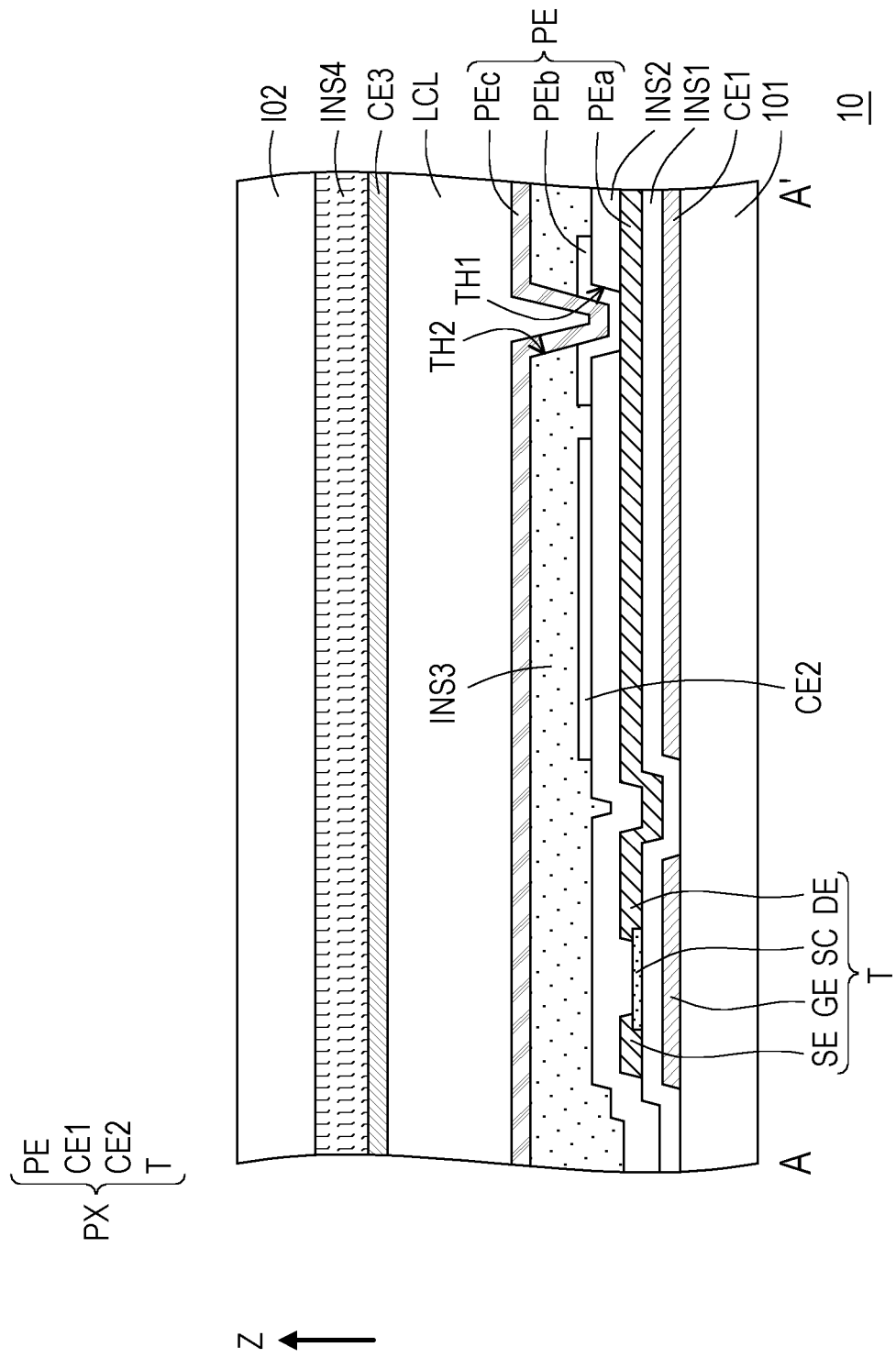
FIG. 2 is a schematic cross-sectional view of the display panel of FIG. 1.

FIG. 1 is a schematic top view of a display panel according to the first embodiment of the disclosure. FIG. 2 is a schematic cross-sectional view of the display panel of FIG. 1. FIG. 2 corresponds to a section line A-A' of FIG. 1. FIGS. 3A to 3I are cross-sectional views of processes of a manufacturing method of the display panel of FIG. 2. FIGS. 4A to 4G are schematic top views of each of film layers of the display panel of FIG. 1. For clarity of description, FIG. 1 does not show a liquid crystal layer LCL, a second substrate 102, a fourth insulation layer INS4, and a third common electrode CE3 of FIG. 2.

Referring to FIGS. 1 and 2, a display panel 10 includes a first substrate 101 and multiple scan lines GL, multiple data lines DL, and multiple pixel structures PX disposed on the first substrate 101. In this embodiment, the data lines DL may be disposed along a direction X, and each of the data lines DL extends towards a direction Y, while the scan lines GL may be disposed along the direction Y, and each of the scan lines GL extends towards the direction X. The direction X is not parallel to the direction Y. In this embodiment, the direction X is perpendicular to the direction Y, but the disclosure is not limited thereto. More specifically, the scan lines GL intersect the data lines DL to define multiple pixel areas PA. The pixel structures PX are disposed in the pixel areas PA, and are electrically connected to the data lines DL and the scan lines GL.

The pixel structure PX includes an active element T, a pixel electrode PE, a first common electrode CE1, and a second common electrode CE2. The pixel electrode PE is electrically connected to the active element T, and is electrically insulated from the first common electrode CE1 and the second common electrode CE2. For example, the active element T includes a semiconductor pattern SC, a source SE, a drain DE, and a gate GE. The semiconductor pattern SC is used as a channel layer of the active element T, and the source SE and the drain DE are electrically connected to two different areas of the semiconductor pattern SC, respectively. In some embodiments, an ohmic contact layer is further provided between the source SE and the semiconductor pattern SC, and between the drain DE and the semiconductor pattern SC. A material of the ohmic contact layer may be, for example, a doped amorphous silicon layer, but the disclosure is not limited thereto. In this embodiment, a first insulation layer INS1 is disposed between the gate GE and the semiconductor pattern SC, and the gate GE is optionally disposed below the semiconductor pattern SC to form a bottom-gate type active element. The first insulation layer INS1 is, for example, a gate insulation layer, and a material thereof may include silicon oxide, silicon nitride, or other suitable dielectric materials. However, the disclosure is not limited thereto. In other embodiments, the gate GE may also be disposed above the semiconductor pattern SC to form a top-gate type active element. In this embodiment, the active element T is, for example, an amorphous silicon thin film transistor (a-Si TFT), but the disclosure is not limited thereto. In other embodiments, the active element T may also be a polycrystalline silicon TFT (poly-Si TFT) or a metal oxide semiconductor TFT.

Furthermore, the pixel electrode PE includes a first sub-electrode PEa, a second sub-electrode PEb, and a third sub-electrode PEc, and the first sub-electrode PEa, the second sub-electrode PEb, and the third sub-electrode PEc are electrically connected to one another. The first sub-electrode PEa is coupled to the drain DE of the active element T. The second sub-electrode PEb is coupled to the first sub-electrode PEa. The third sub-electrode PEc is coupled to the second sub-electrode PEb. It is particularly noted that the first sub-electrode PEa, the second sub-electrode PEb, and the third sub-electrode PEc respectively belong to different film layers. In this embodiment, the first sub-electrode PEa, and the source SE and the drain DE of the active element T are the same film layer. A second insulation layer INS2 is disposed between the first sub-electrode PEa and the second sub-electrode PEb. A third insulation layer INS3 is disposed between the second sub-electrode PEb and the third sub-electrode PEc. The second insulation layer INS2 has a first opening hole TH1 overlapping the first sub-electrode PEa. The second sub-electrode PEb is disposed on the second insulation layer INS2, and a part of the second sub-electrode PEb extends into the first opening hole TH1 and covers a surface of the first sub-electrode PEa exposed by the first opening hole TH1, so as to be electrically connected to the first sub-electrode PEa. The third insulation layer INS3 has a second opening hole TH2 overlapping the second sub-electrode PEb. The third sub-electrode PEc is disposed on the third insulation layer INS3, and a part of the third sub-electrode PEc extends into the second opening hole TH2 and covers a surface of the second sub-electrode PEb exposed by the second opening hole TH2, so as to be electrically connected to the second sub-electrode PEb through the second opening hole TH2. In this embodiment, the second opening hole TH2 overlaps the first opening hole TH1 and the second sub-electrode PEb, and exposes a part of the surface of the second sub-electrode PEb, but the disclosure is not limited thereto. In other embodiments, the second opening hole TH2 overlaps the second sub-electrode PEb and exposes a part of the surface of the second sub-electrode PEb, the second opening hole TH2 does not overlap the first opening hole TH1, and the third sub-electrode PEc may also be electrically connected to the second sub-electrode PEb through the second opening hole TH2. In this embodiment, the third sub-electrode PEc of the pixel electrode PE may optionally cover the corresponding active element T, the data line DL, and the scan line GL, but the disclosure is not limited thereto.

It should be noted that the above overlapping relationship between two components is, for example, that projections of the two components along a direction Z (a direction perpendicular to the first substrate 101) overlap each other (for example, that projections of the two components on the first substrate 101 overlap each other). Hereinafter, if not specifically mentioned, the overlapping relationships between the components are all based on the direction Z as a projection direction, which will not be will not be further reiterated in the following.

In this embodiment, the second insulation layer INS2 may be a passivation layer, and a material thereof may include, for example, silicon nitride, silicon oxide, silicon carbide, or aluminum oxide, but the material of the second insulation layer INS2 is not limited thereto. A material of the third insulation layer INS3 may include an inorganic material (for example, silicon oxide, silicon nitride, silicon oxynitride, other suitable materials, or a stack layer of at least two of the above materials), an organic material (for example, polyester, polyolefin, polypropylene, polycarbonate, polyalkylene oxide, polyphenylene, polyether, polyketone, polyol, polyaldehyde Class, other suitable materials, or a combination of the above), other suitable materials, or a combination of the above. For example, the material of the third insulation layer INS3 may include the organic material as a planarization layer, but the disclosure is not limited thereto.

On the other hand, the pixel structure PX further includes the first common electrode CE1 and the second common electrode CE2. In this embodiment, the first common electrode CE1 overlaps the second common electrode CE2, but the disclosure is not limited thereto. The first common electrode CE1 is disposed between the first sub-electrode PEa and the first substrate 101, and overlaps the first sub-electrode PEa of the pixel electrode PE. A portion of the first insulation layer INS1 is disposed between the first sub-electrode PEa and the first common electrode CE1, and overlaps the first sub-electrode PEa and the first common electrode CE1. The second common electrode CE2 is disposed between the first sub-electrode PEa and the third sub-electrode PEc, and overlaps the first sub-electrode PEa and the third sub-electrode PEc. A portion of the second insulation layer INS2 is disposed between the first sub-electrode PEa and the second common electrode CE2, and overlaps the first sub-electrode PEa and the second common electrode CE2. A portion of the third insulation layer INS3 is disposed between the second common electrode CE2 and the third sub-electrode PEc, and overlaps the second common electrode CE2 and the third sub-electrode PEc. It is particularly noted that the first sub-electrode PEa of the pixel electrode PE, the first common electrode CE1, and the portion of the first insulation layer INS1 disposed between and overlapping the first sub-electrode PEa and the first common electrode CE1 may form a first storage capacitor of the pixel structure PX. The first sub-electrode PEa of the pixel electrode PE, the second common electrode CE2, and the portion of the second insulation layer INS2 disposed between and overlapping the first sub-electrode PEa and the second common electrode CE2 may form a second storage capacitor of the pixel structure PX. The third sub-electrode PEc of the pixel electrode PE, the second common electrode CE2, and the portion of the third insulation layer INS3 disposed between and overlapping the third sub-electrode PEc and the second common electrode CE2 may form a third storage capacitor of the pixel structure PX.

Compared with the related art where only two conductor layers and the insulation layer sandwiched therebetween are used in each of the pixel structures to form the storage capacitor, in the disclosure, each of the pixel structures PX has three storage capacitors. In the disclosure, a storage capacitance between the common electrodes and the sub-electrodes of the pixel electrode is relatively large. Therefore, a voltage holding ratio of the pixel structure PX may be increased, thereby improving the display quality of the display panel 10 during low-frequency operation. Especially when a size of the pixel structure PX is reduced to meet the demand for a high-resolution display screen, the above disposition of the storage capacitors may more significantly improve the display quality during the low-frequency operation.

In this embodiment, the first common electrode CE1 and the gate GE of the active element T are the same film layer, and are electrically insulated from each other. The second common electrode CE2 and the second sub-electrode PEb of the pixel electrode PE are the same film layer, and are electrically insulated from each other. In other words, the two common electrodes of the pixel structure PX in the disclosure are highly integrated with the current panel manufacturing process. Therefore, without adding additional manufacturing processes, the display panel 10 in the disclosure may have both cost advantages and better display quality during the low-frequency operation.

For example, in this embodiment, the first common electrodes CE1 of the pixel structures PX disposed along the direction X may be connected to one another to have a common electrical potential. Similarly, the second common electrodes CE2 of the pixel structures PX may also be connected to one another, and the common electrical potential of the second common electrodes may be the same as or different from the common electrical potential of the first common electrodes CE1, but the disclosure is not limited thereto.

Furthermore, the display panel 10 further includes the second substrate 102, the third common electrode CE3, and the liquid crystal layer LCL. The second substrate 102 and the first substrate 101 are disposed opposite to each other. The third common electrode CE3 is disposed on a surface of the second substrate 102 facing the first substrate 101. The liquid crystal layer LCL is disposed between the third sub-electrode PEc of the pixel electrode PE and the third common electrode CE3. In this embodiment, the third sub-electrode PEc of the pixel electrode PE is, for example, a reflective electrode for reflecting ambient light. A material of the reflective electrode may include a metal material with high reflectivity or other suitable materials. In other words, the display panel 10 in this embodiment is a reflective liquid crystal display panel. However, the disclosure is not limited thereto. In other embodiments, the invention of the three storage capacitors in the disclosure may also be applied to the pixel structures of other types of display panels, for example, to the pixel structure with the reflective electrode in a reflective area of the display panel (such as a transflective type liquid crystal display panel), but the disclosure is not limited thereto.

Hereinafter, a manufacturing method of the display panel 10 will be exemplarily described.

Figure 3C:
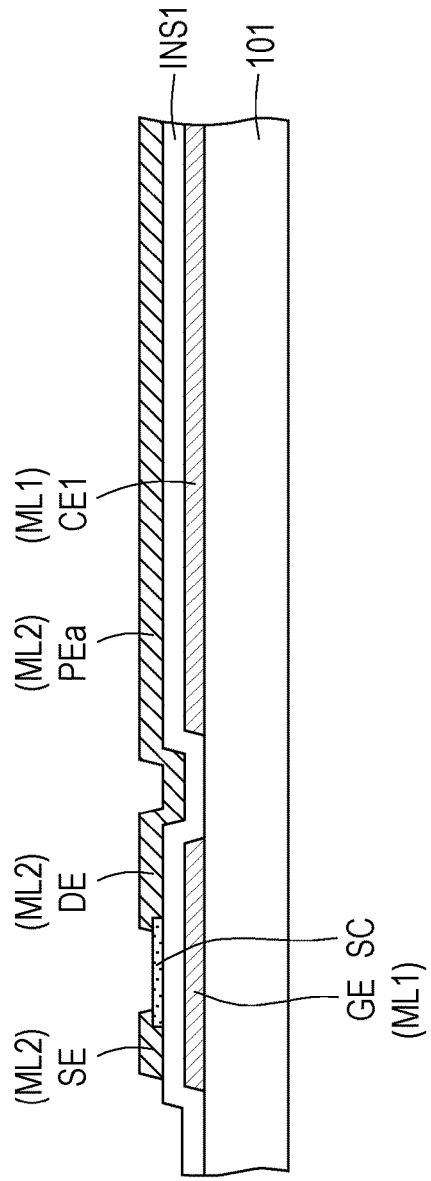
Figure 4A:
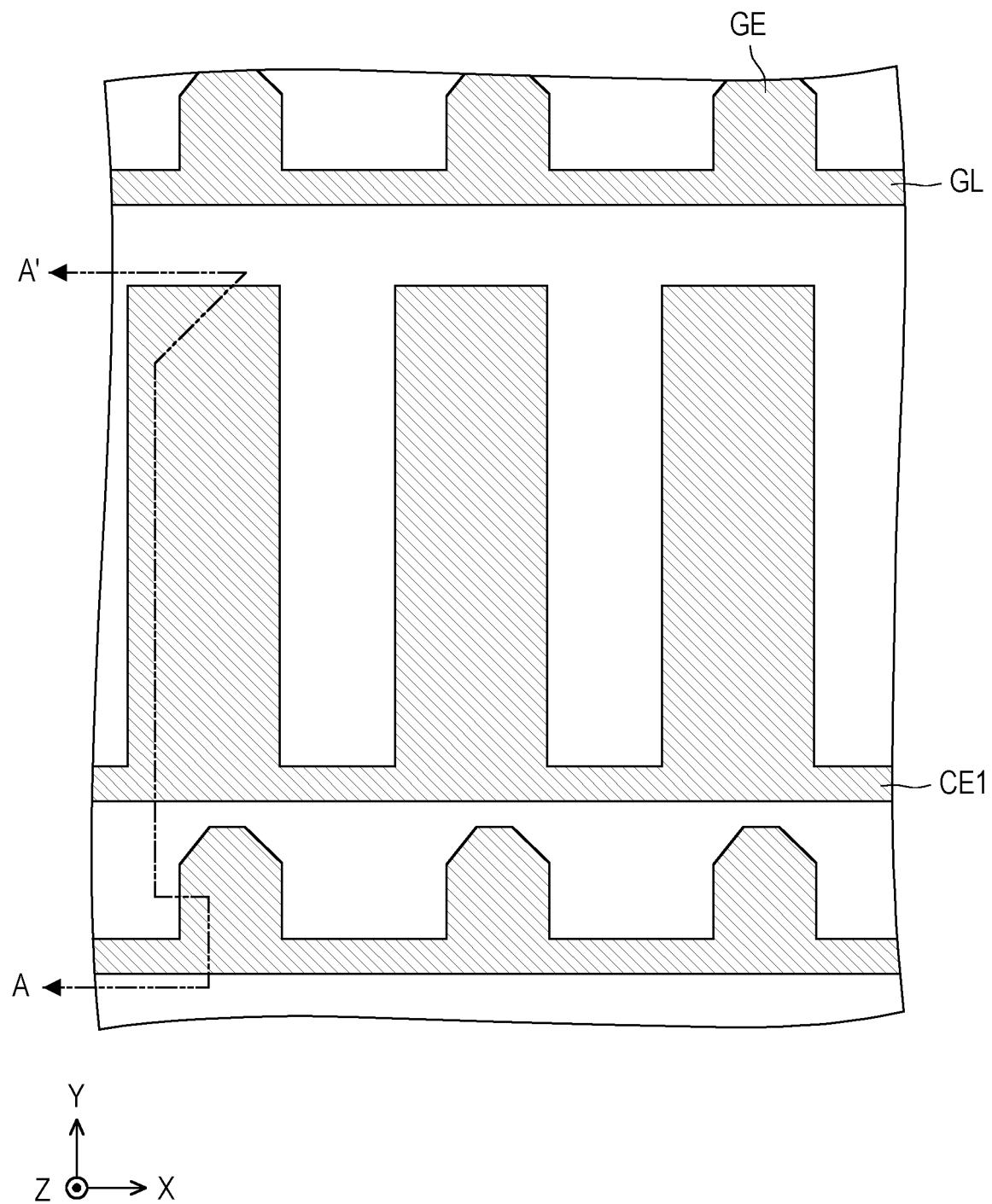
FIGS. 4A to 4G are schematic top views of each of film layers of the display panel of FIG. 1.
Figure 4B:
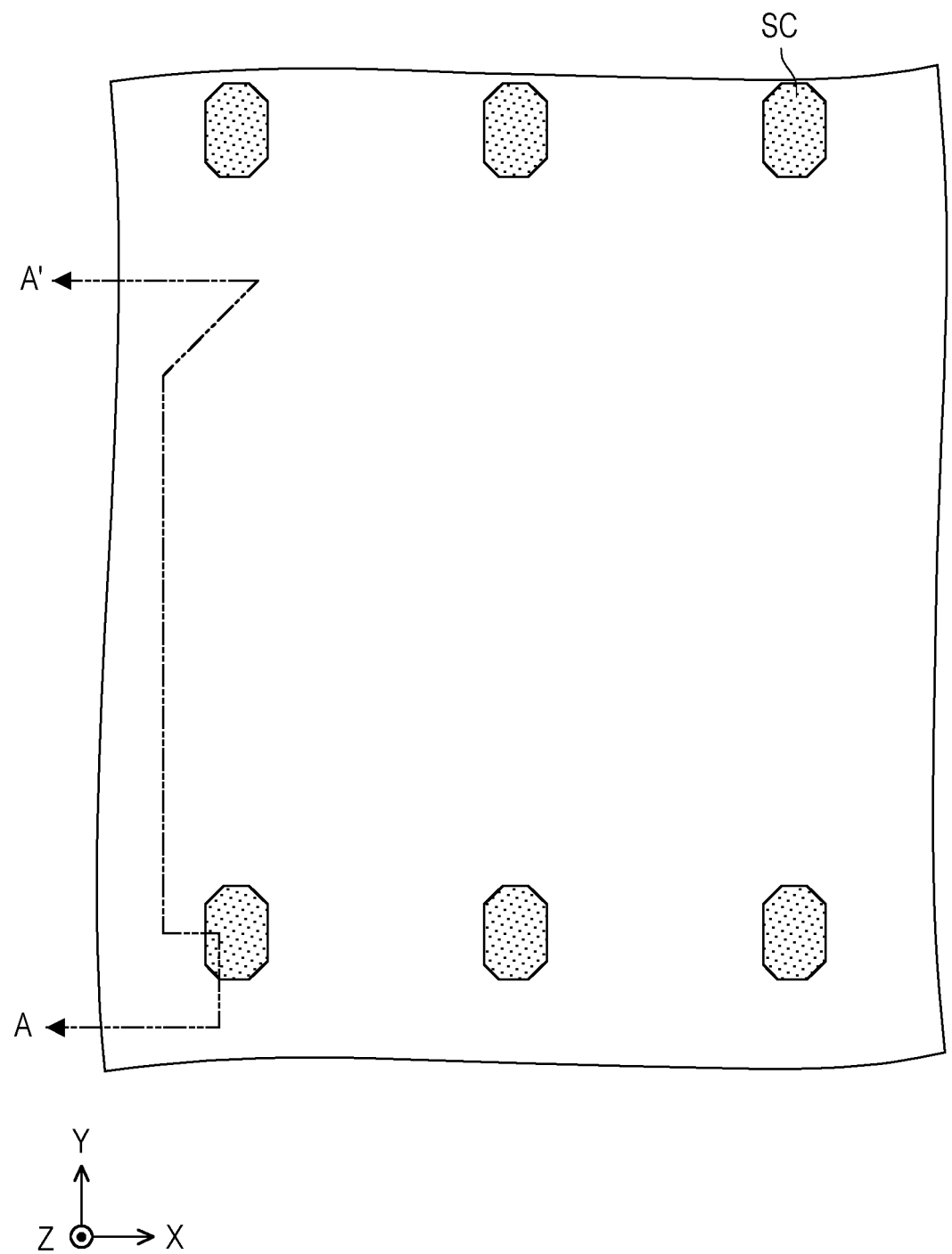

Referring to FIGS. 1, 3A, and 4A, FIG. 4A is a schematic top view of a first metal layer ML1. First, the first metal layer ML1 is formed on the first substrate 101. The first metal layer ML1 includes the gate GE, the scan line GL, and the first common electrode CE1. A material of the first metal layer ML1 may include, for example, molybdenum, aluminum, copper, nickel, chromium, an alloy of the above, or a stacked structure of the above, but the disclosure is not limited thereto. Next, the first insulation layer INS1 is formed on the first metal layer ML1, as shown in FIG. 3B. In this embodiment, after the first insulation layer INS1 is formed, the semiconductor pattern SC may be formed on the first insulation layer INS1. A top view of the semiconductor pattern SC is shown in FIG. 4B. A material of the semiconductor pattern SC may include, for example, an amorphous silicon semiconductor, a monocrystalline silicon semiconductor, a polycrystalline silicon semiconductor, or a metal oxide semiconductor, but the disclosure is not limited thereto.

Figure 4C:
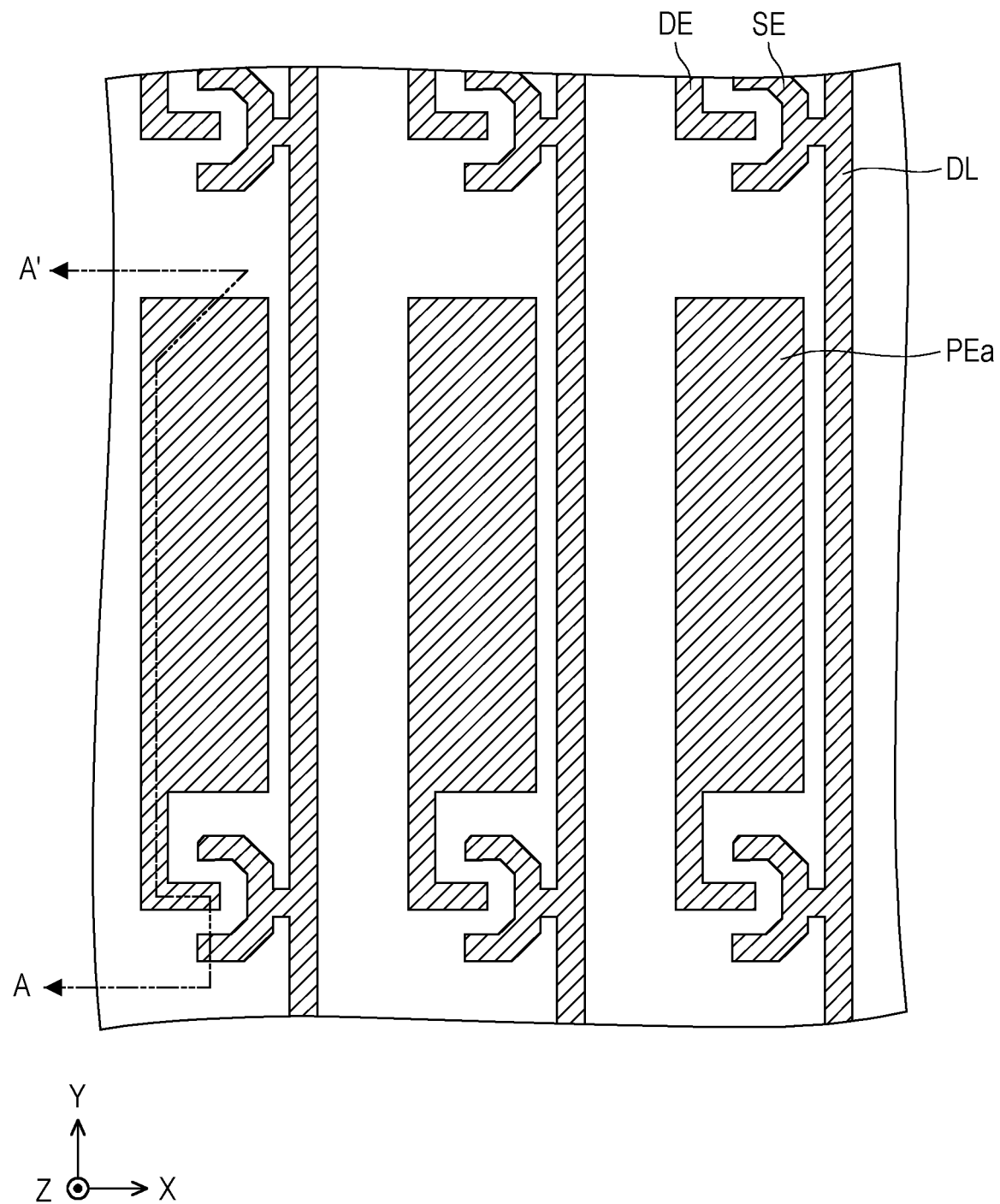

Referring to FIGS. 1, 3C, and 4C, a second metal layer ML2 is formed on the first insulation layer INS1, and a schematic top view of the second metal layer ML2 is shown in FIG. 4C. The second metal layer ML2 includes the data line DL, the drain DE, the source SE, and the first sub-electrode PEa. The first sub-electrode PEa overlaps the first common electrode CE1, and is electrically connected to the drain DE. In particular, the source SE, the drain DE, the gate GE, the semiconductor pattern SC, and a part of the first insulation layer INS1 may form the active element T in this embodiment. A material of the second metal layer ML2 may include, for example, molybdenum, aluminum, copper, nickel, chromium, an alloy of the above, or a stacked structure of the above, but the disclosure is not limited thereto.

In the embodiment where the ohmic contact layer is further provided between the source SE and the semiconductor pattern SC, and between the drain DE and the semiconductor pattern SC, for example, in the step of FIG. 3B, the doped amorphous silicon layer may be further formed on the semiconductor pattern SC. Then, when the second metal layer ML2 in FIG. 3C is formed, the doped amorphous silicon layer that is not covered by the drain DE and the source SE is removed, and the doped amorphous silicon layer that is covered by the drain DE and the source SE is left as the ohmic contact layer. However, the disclosure is not limited thereto.

Figure 3D:
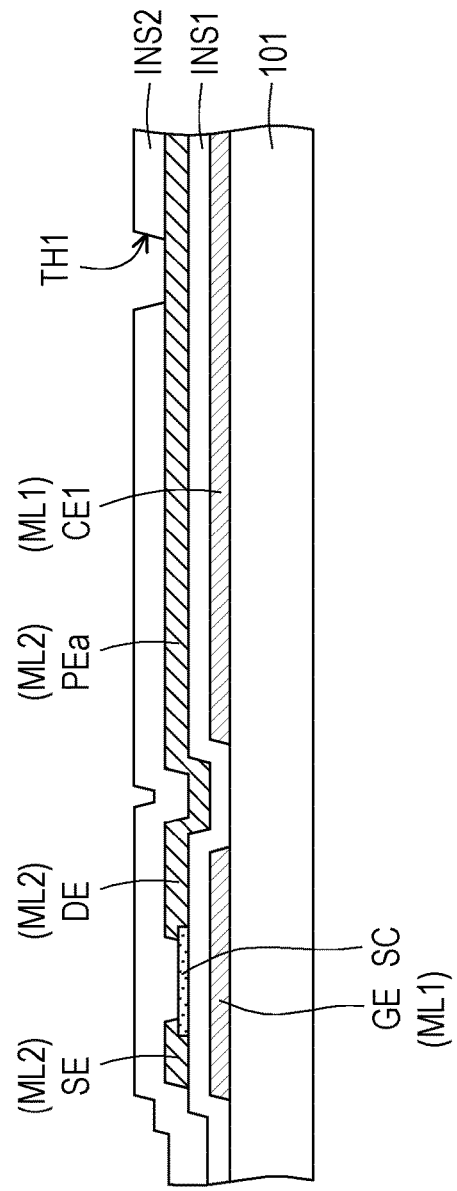
Figure 4D:
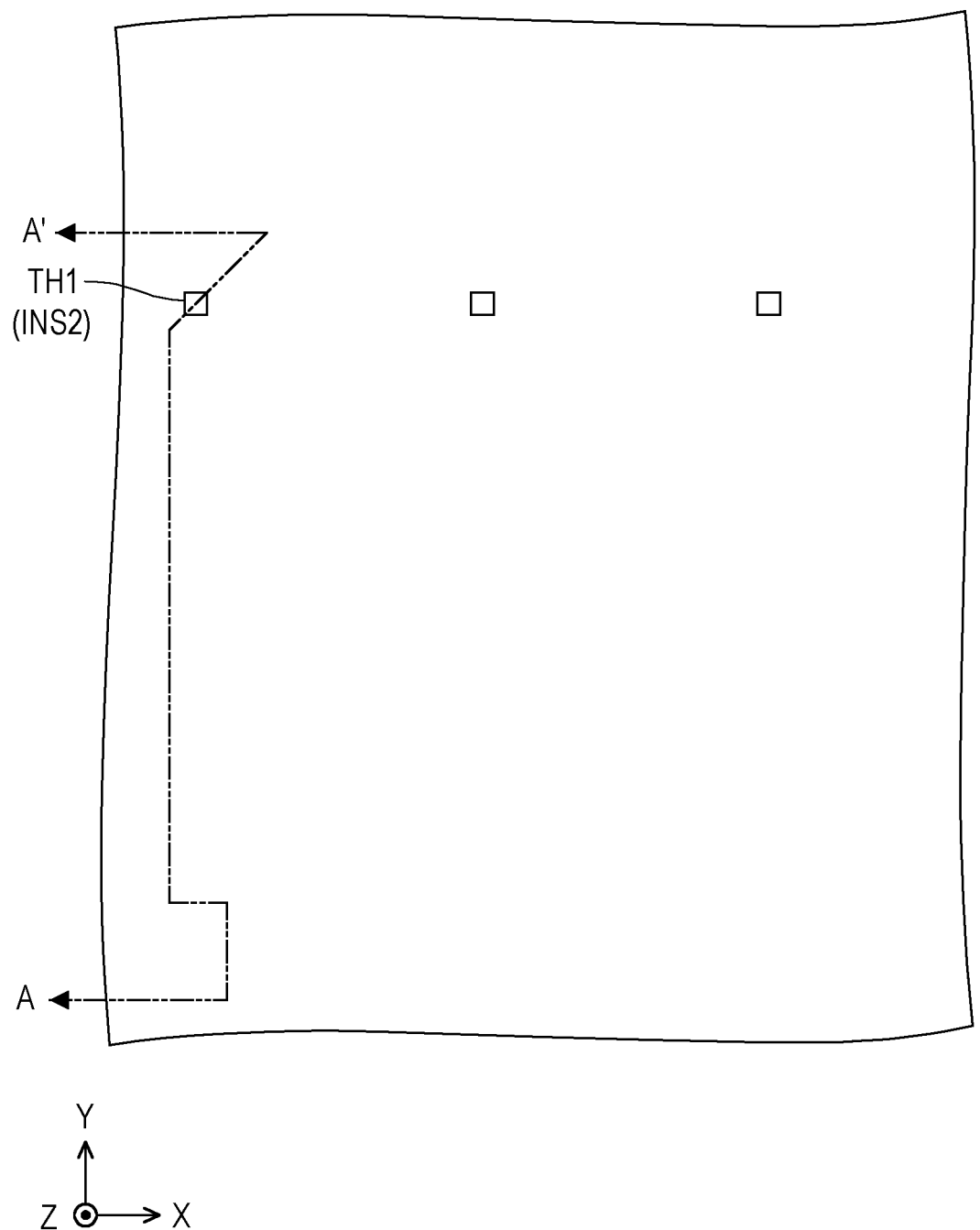

After the second metal layer ML2 is completed, the second insulation layer INS2 is formed on the second metal layer ML2, as shown in FIG. 3D. Next, the first opening hole TH1 is formed in the second insulation layer INS2, and the first opening hole TH1 exposes a part of the first sub-electrode PEa. A schematic top view of the first opening hole TH1 is shown in FIG. 4D.

Figure 3E:
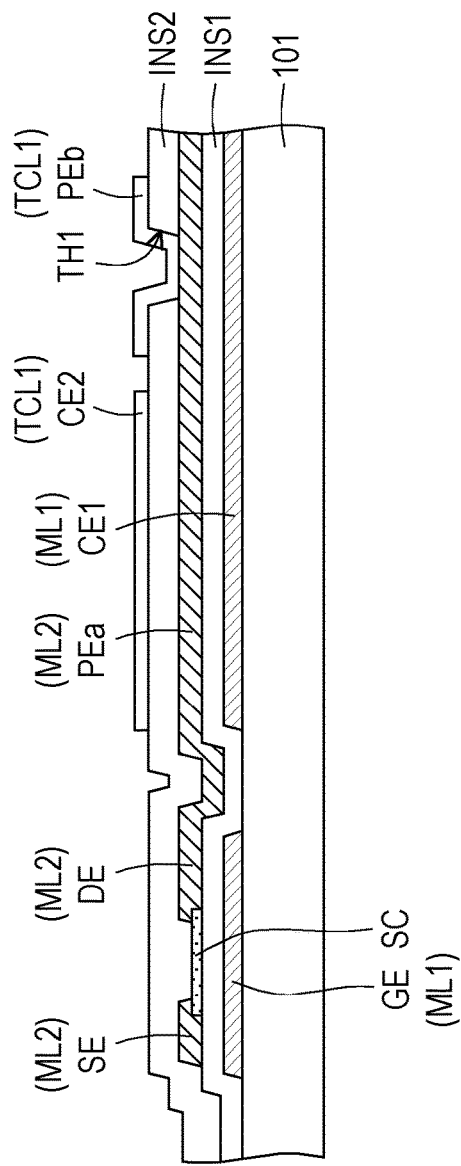
Figure 3F:
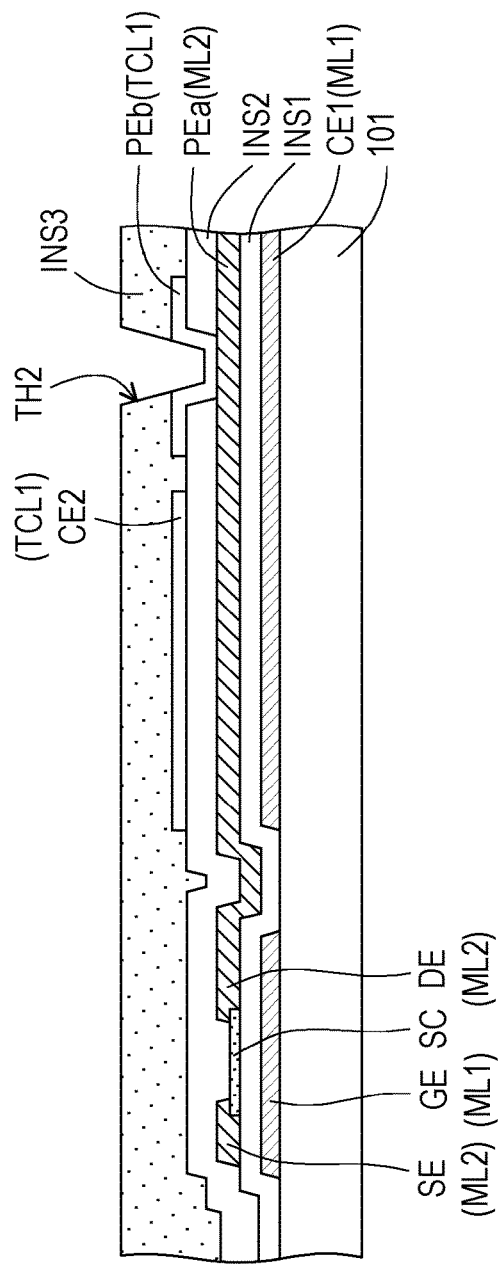
Figure 4E:
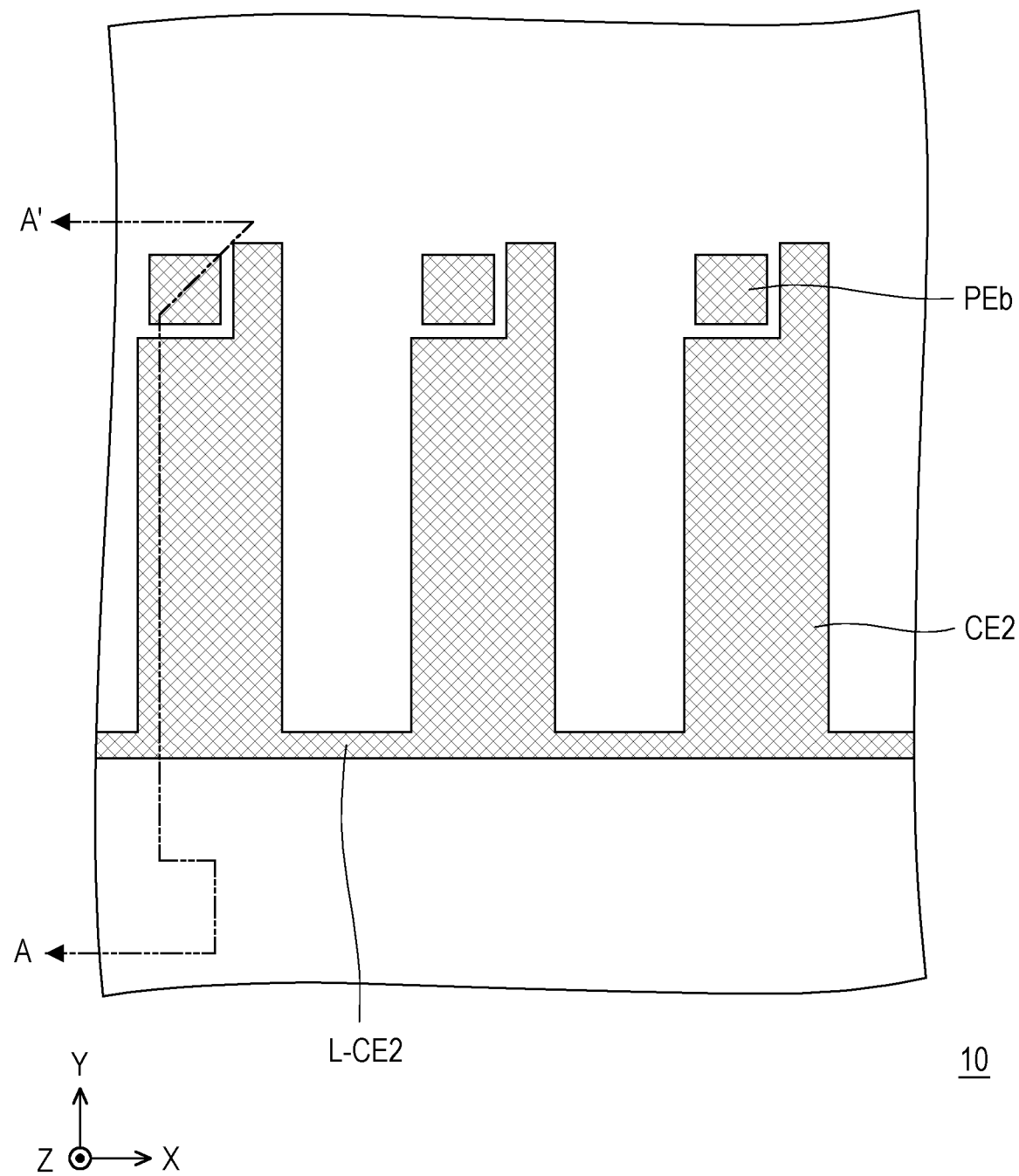
Figure 4F:
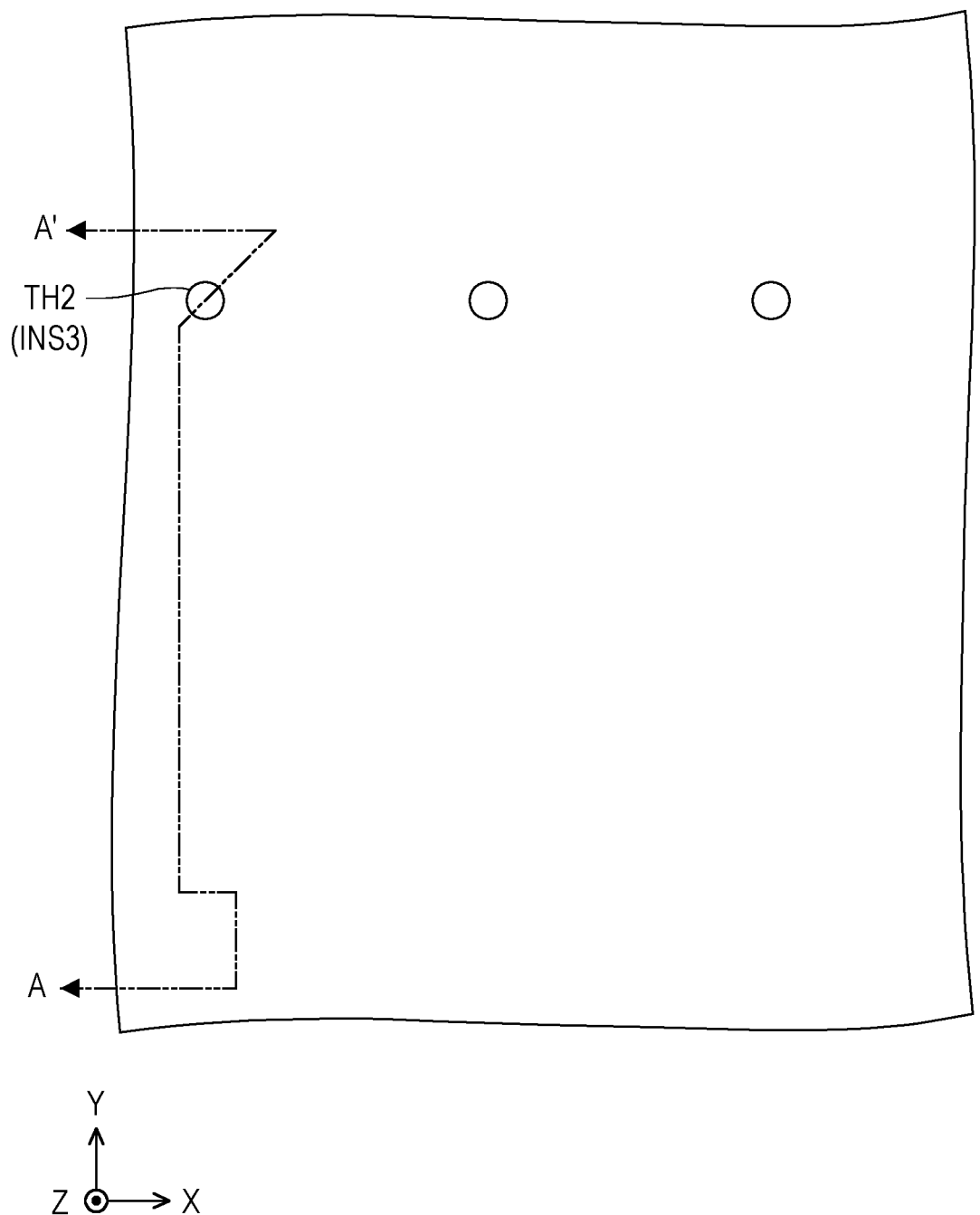

Referring to FIGS. 3E and 4E, a first transparent conductive layer TCL1 is formed on the second insulation layer INS2. A schematic top view of the first transparent conductive layer TCL1 is shown in FIG. 4E. The first transparent conductive layer TCL1 includes the second common electrode CE2 and the second sub-electrode PEb. The second common electrode CE2 overlaps the first sub-electrode PEa, and the second sub-electrode PEb is electrically connected to the first sub-electrode PEa through the first opening hole TH1. Then, the third insulation layer INS3 is formed on the first transparent conductive layer TCL1, as shown in FIG. 3F. Next, the second opening hole TH2 is formed in the third insulation layer INS3, and this second opening hole TH2 exposes at least a part of the second sub-electrode PEb. A schematic top view of the second opening hole TH2 is shown in FIG. 4F.

Figure 3G:
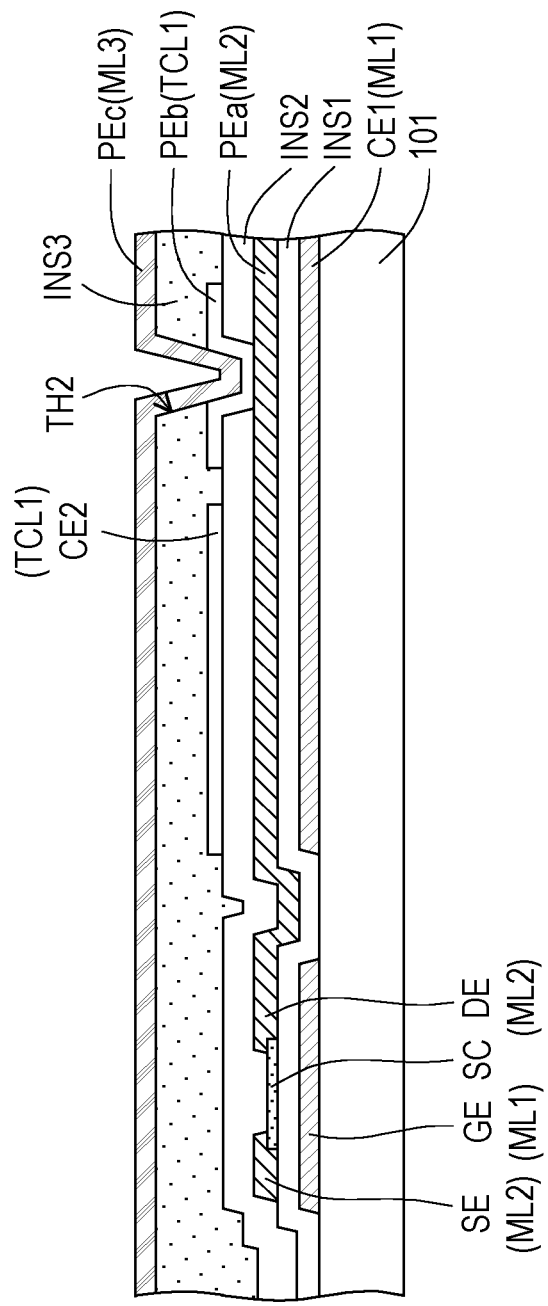
Figure 4G:
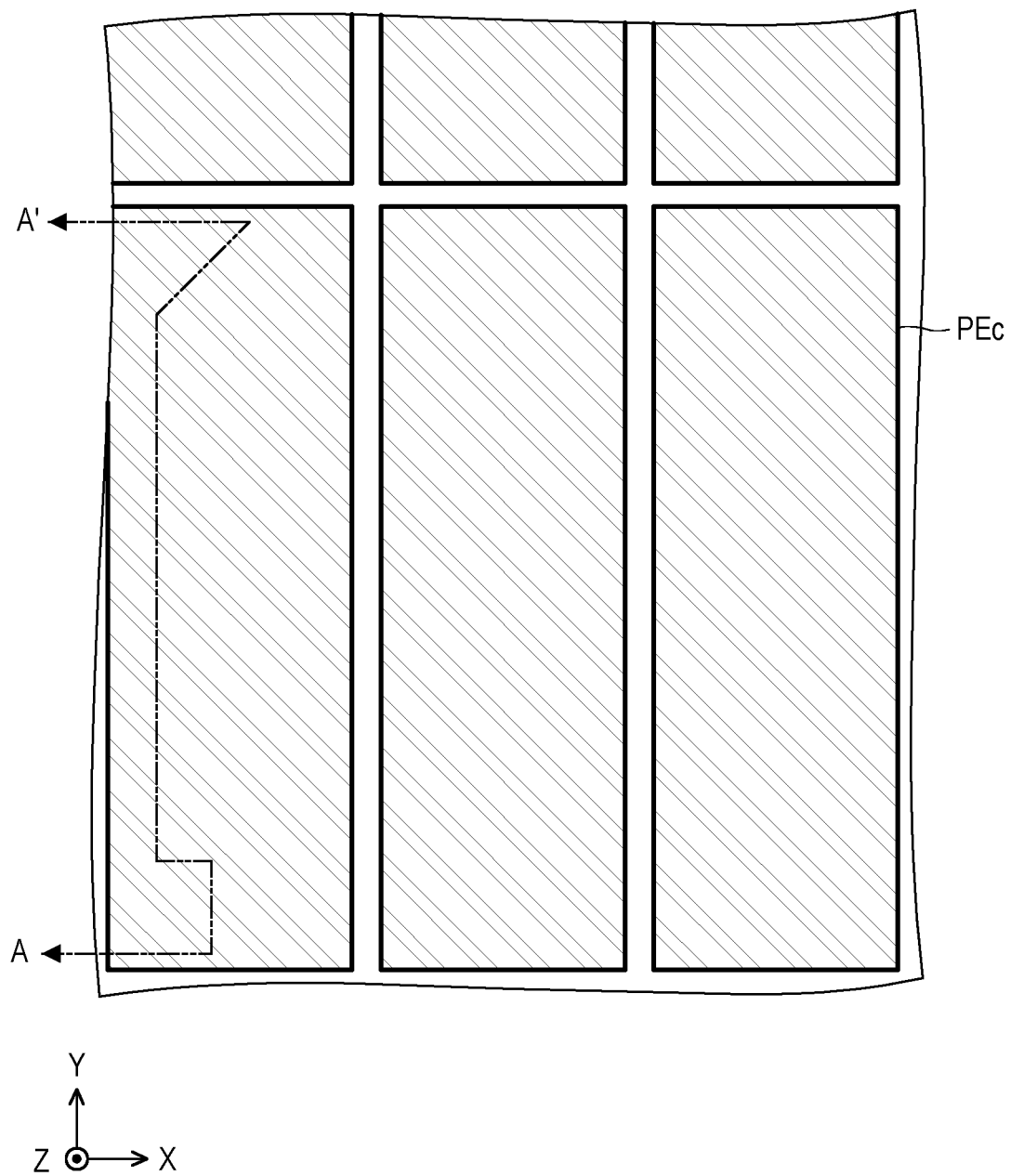

Referring to FIGS. 3G and 4G, after the third insulation layer INS3 is completed, a third metal layer ML3 is formed on the third insulation layer INS3. A top view of the third metal layer ML3 is shown in FIG. 4G. The third metal layer ML3 includes the third sub-electrode PEc. The second common electrode CE2 overlaps the third sub-electrode PEc, and the third sub-electrode PEc is electrically connected to the second sub-electrode PEb through the second opening hole TH2. In particular, the first sub-electrode PEa, the second sub-electrode PEb, and the third sub-electrode PEc that are electrically connected to one another and located in different film layers may form the pixel electrode PE, and the pixel electrode PE, the active element T, the first common electrode CE1, and the second common electrode CE2 may form the pixel structure PX.

Figure 3H:
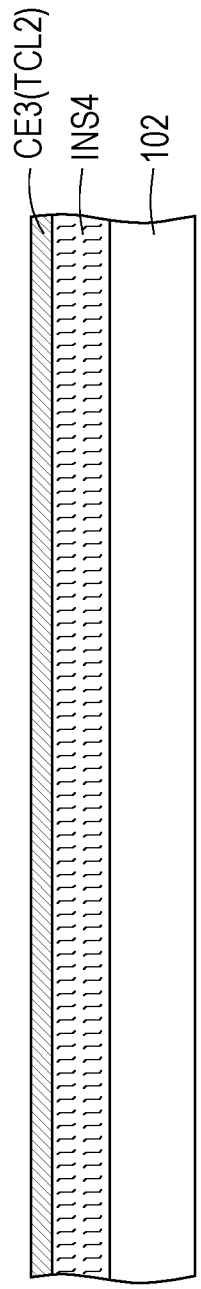
Figure 3I:
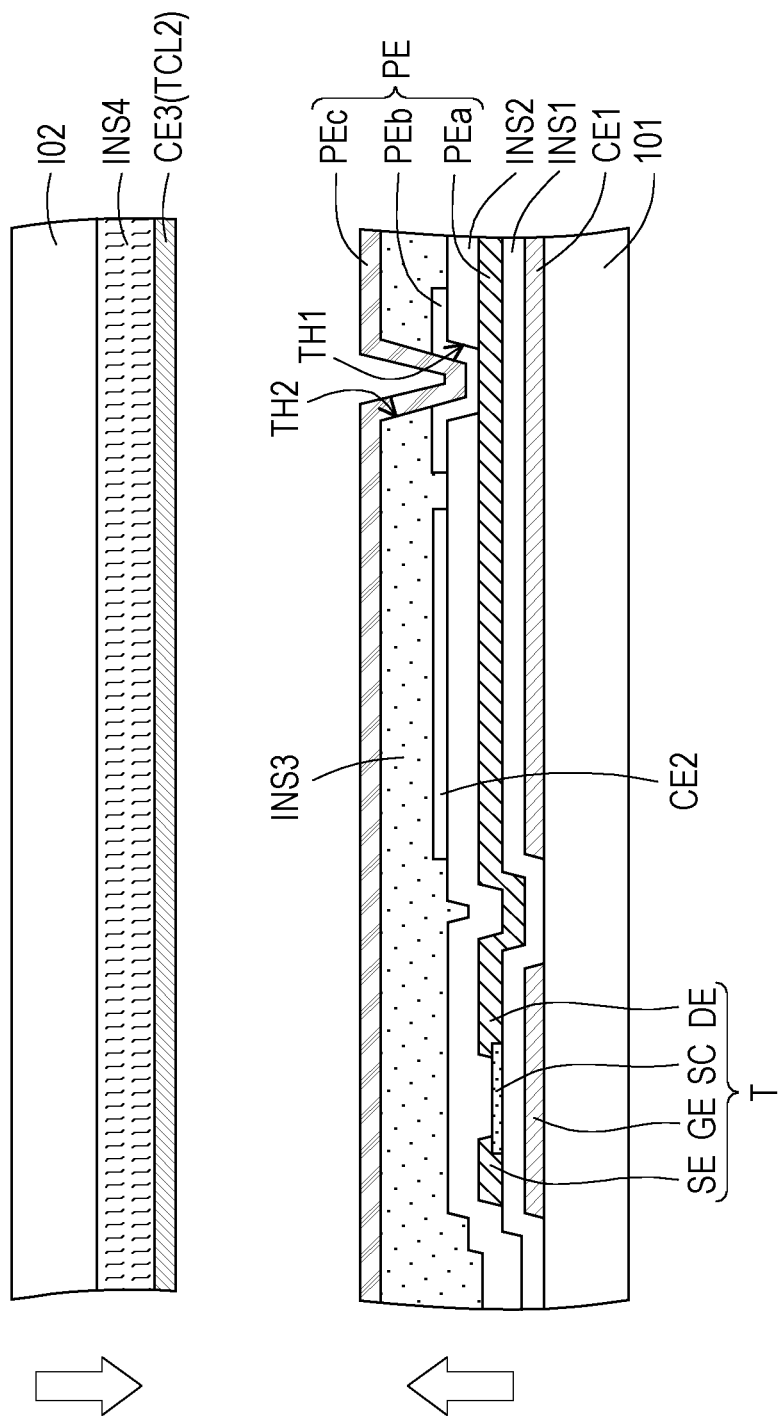

Referring to FIGS. 3H and 3I, the manufacturing method of the display panel 10 further includes the following steps. A second transparent conductive layer TCL2 is formed on the second substrate 102. The second transparent conductive layer TCL2 includes the third common electrode CE3. After the second transparent conductive layer TCL2 is completed, the first substrate 101 and the second substrate 102 are assembled, so that the first substrate 101 and the second substrate 102 are disposed opposite to each other, and the liquid crystal layer LCL is disposed between the first substrate 101 and the second substrate 102. For example, in this embodiment, the fourth insulation layer INS4 may be further formed between the second transparent conductive layer TCL2 and the second substrate 102, but the disclosure is not limited thereto. At this point, the manufacture of the display panel 10 in this embodiment is completed.

Some other embodiments are provided below to describe the disclosure in detail, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 5:
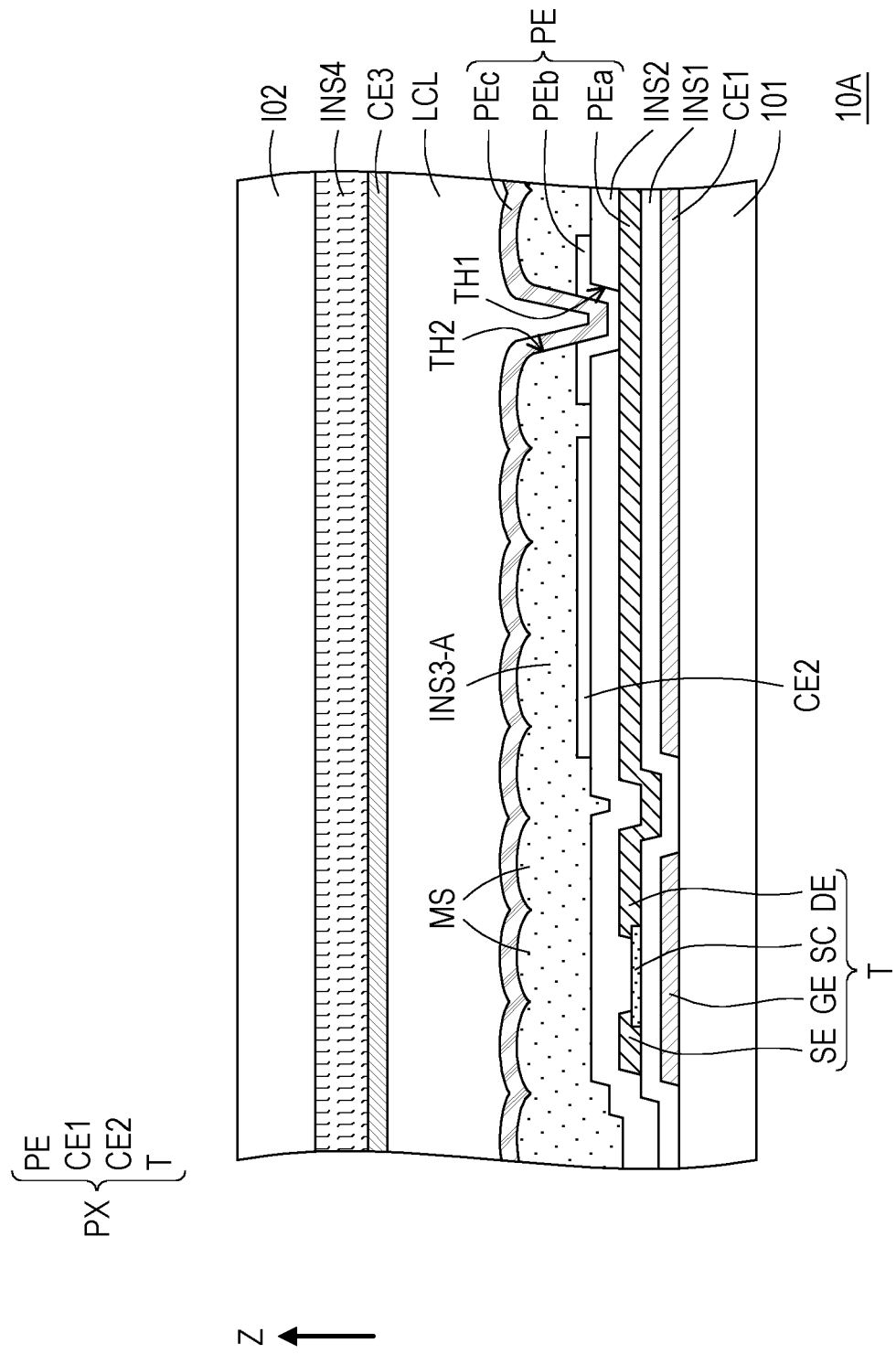
FIG. 5 is a schematic cross-sectional view of a display panel according to the second embodiment of the disclosure.

FIG. 5 is a schematic cross-sectional view of a display panel according to the second embodiment of the disclosure. Referring to FIG. 5, a difference between a display panel 10A in this embodiment and the display panel 10 in FIG. 2 is that a surface configuration of the third insulation layer is different. Specifically, a connecting surface between a third insulation layer INS3-A of the display panel 10A and third sub-electrode PEc of the pixel electrode PE is non-planar. From another point of view, the third insulation layer INS3-A in this embodiment is optionally provided with multiple optical microstructures MS on a side facing the third sub-electrode PEc. For example, the side of the third insulation layer INS3-A facing the third sub-electrode PEc may have an uneven surface. Therefore, a film surface of the third sub-electrode PEc covering the optical microstructures MS is substantially conform to the optical microstructures MS. For example, when the display panel 10A is a reflective liquid crystal display panel (that is, the third sub-electrode PEc is the reflective electrode), through the disposition of the optical microstructures MS, a viewing angle range of the display panel 10A may be increased.

Figure 6:
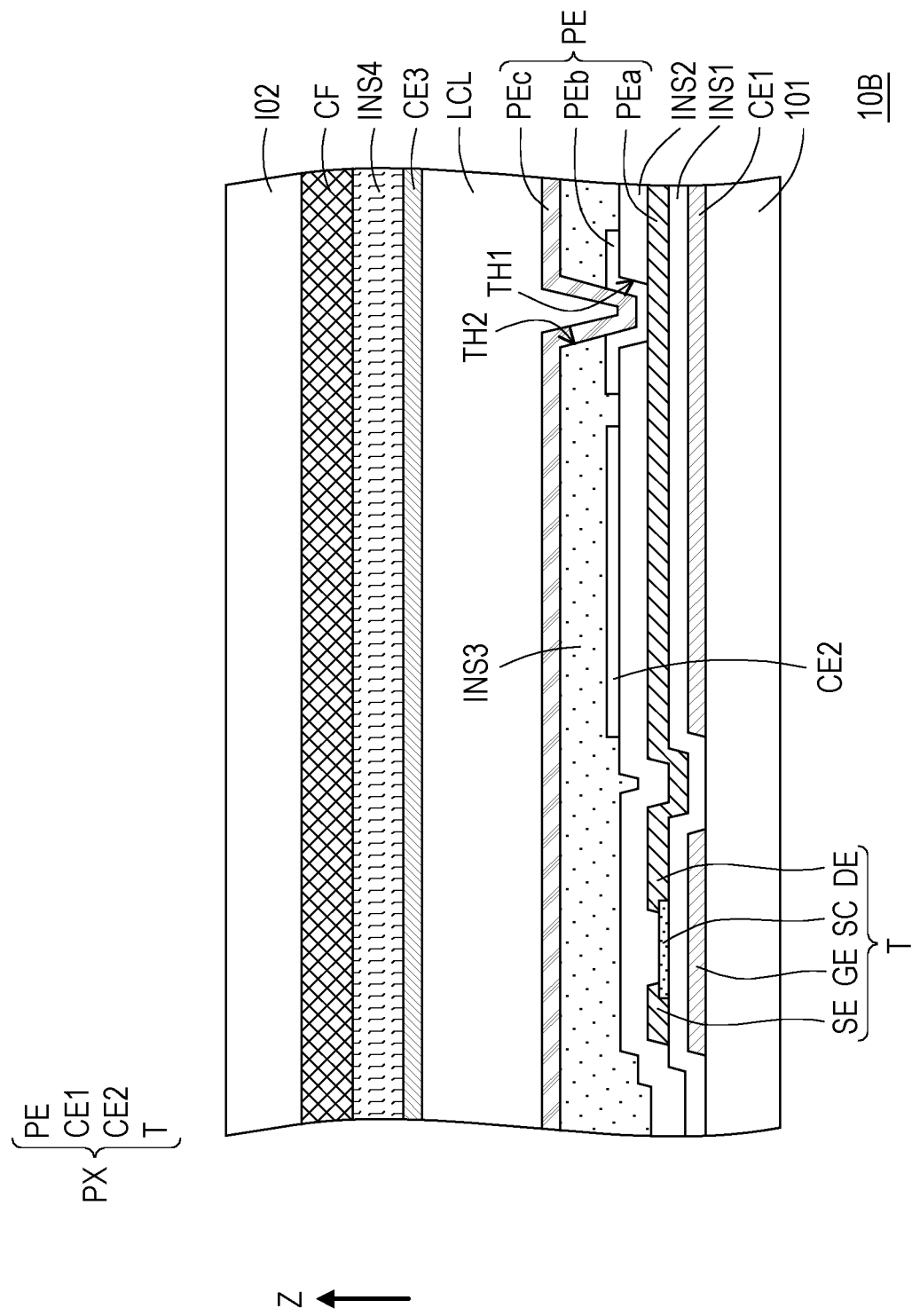
FIG. 6 is a schematic cross-sectional view of a display panel according to the third embodiment of the disclosure.

FIG. 6 is a schematic cross-sectional view of a display panel according to the third embodiment of the disclosure. Referring to FIG. 6, a difference between a display panel 10B in this embodiment and the display panel 10 in FIG. 2 is that the display panel 10B may further include a colored material layer CF disposed between the second substrate 102 and the fourth insulation layer INS4. In other words, the display panel 10B in this embodiment may be a reflective liquid crystal display panel with a color display function.

Figure 7:
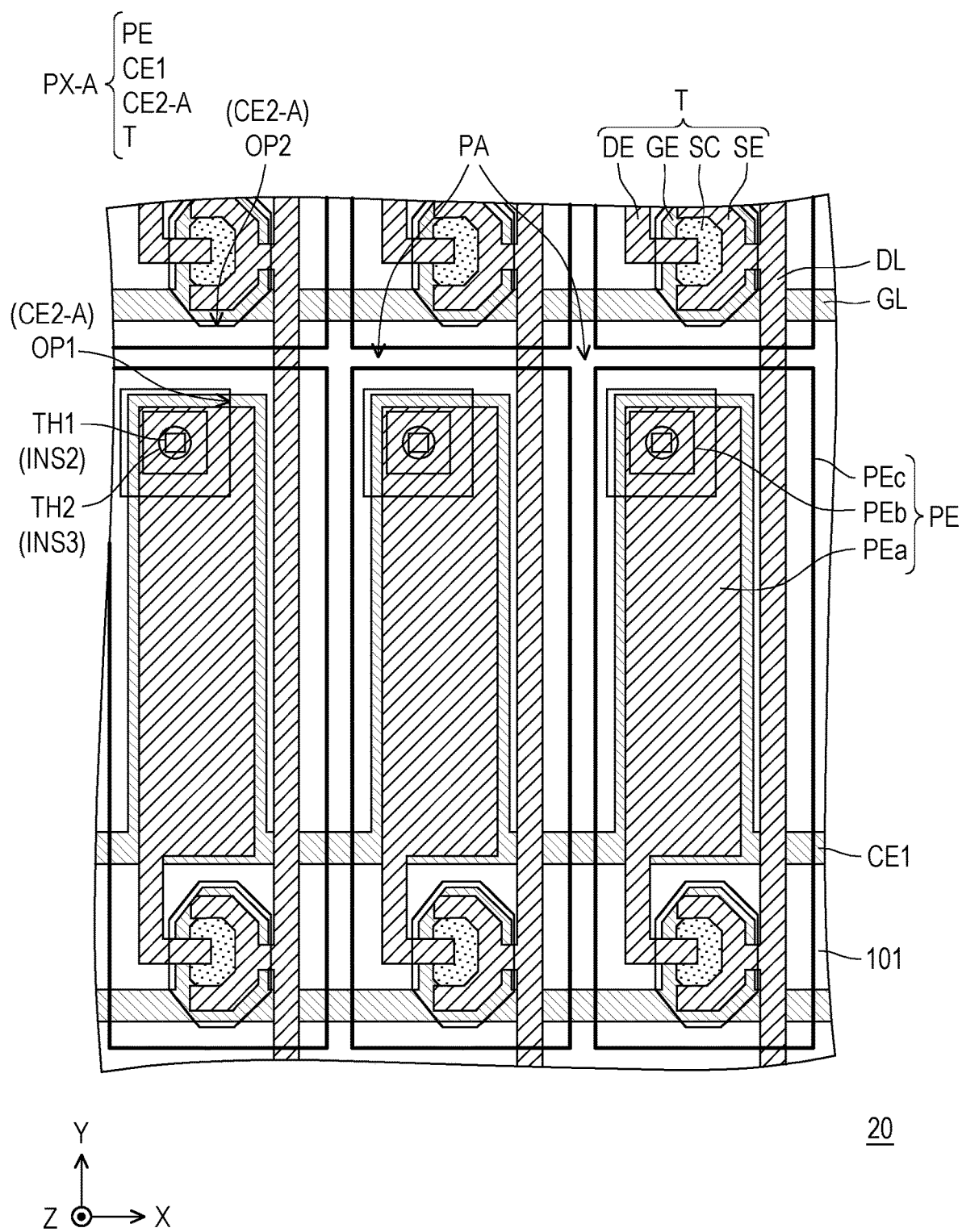
FIG. 7 is a schematic top view of a display panel according to the fourth embodiment of the disclosure.
Figure 8:
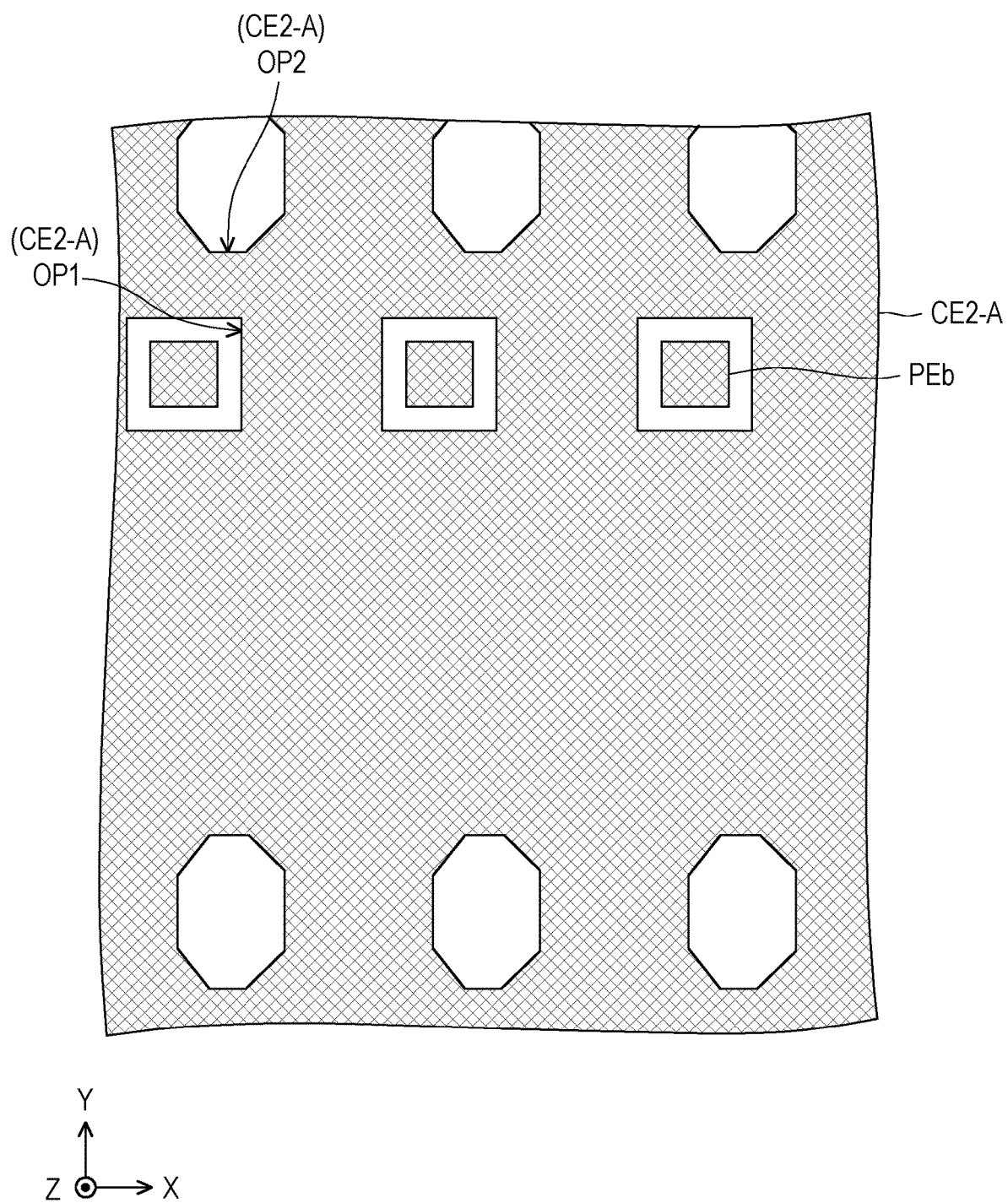
FIG. 8 is a schematic top view of a second common electrode of the display panel of FIG. 7.

FIG. 7 is a schematic top view of a display panel according to the fourth embodiment of the disclosure. FIG. 8 is a schematic top view of a second common electrode of the display panel of FIG. 7. Referring to FIGS. 7 and 8, a difference between a display panel 20 in this embodiment and the display panel 10 in FIG. 1 is that a disposition of the second common electrode is different. Referring to FIGS. 1, 4E, 7, and 8 together, as shown in FIGS. 1 and 4E, each of the pixel structures PX of the display panel 10 includes the second common electrode CE2. The second common electrode CE2 does not overlap the active element T, the scan line GL, and the data line DL. The second common electrodes CE2 of the two pixel structures PX adjacent to each other along the direction X are electrically connected to each other through a connecting line L-CE2 extending along the direction X, and the connecting line L-CE2 intersects and overlaps a part of the data line DL between the two adjacent pixel structures PX. On the other hand, as shown in FIGS. 7 and 8, in this embodiment, each of pixel structures PX-A of the display panel 20 includes a second common electrode CE2-A. The second common electrode CE2-A has a first opening OP1 overlapping the second sub-electrode PEb and a second opening OP2 overlapping the active element T, and the second common electrode CE2-A overlaps the scan lines GL and the data lines DL of the display panel 20. More specifically, the second common electrodes CE2-A are substantially disposed on an entire surface of the second insulation layer INS2 in a display area of the display panel 20, and have the first opening OP1 overlapping the second sub-electrode PEb and the second opening OP2 overlapping the active element T.

Figure 9:
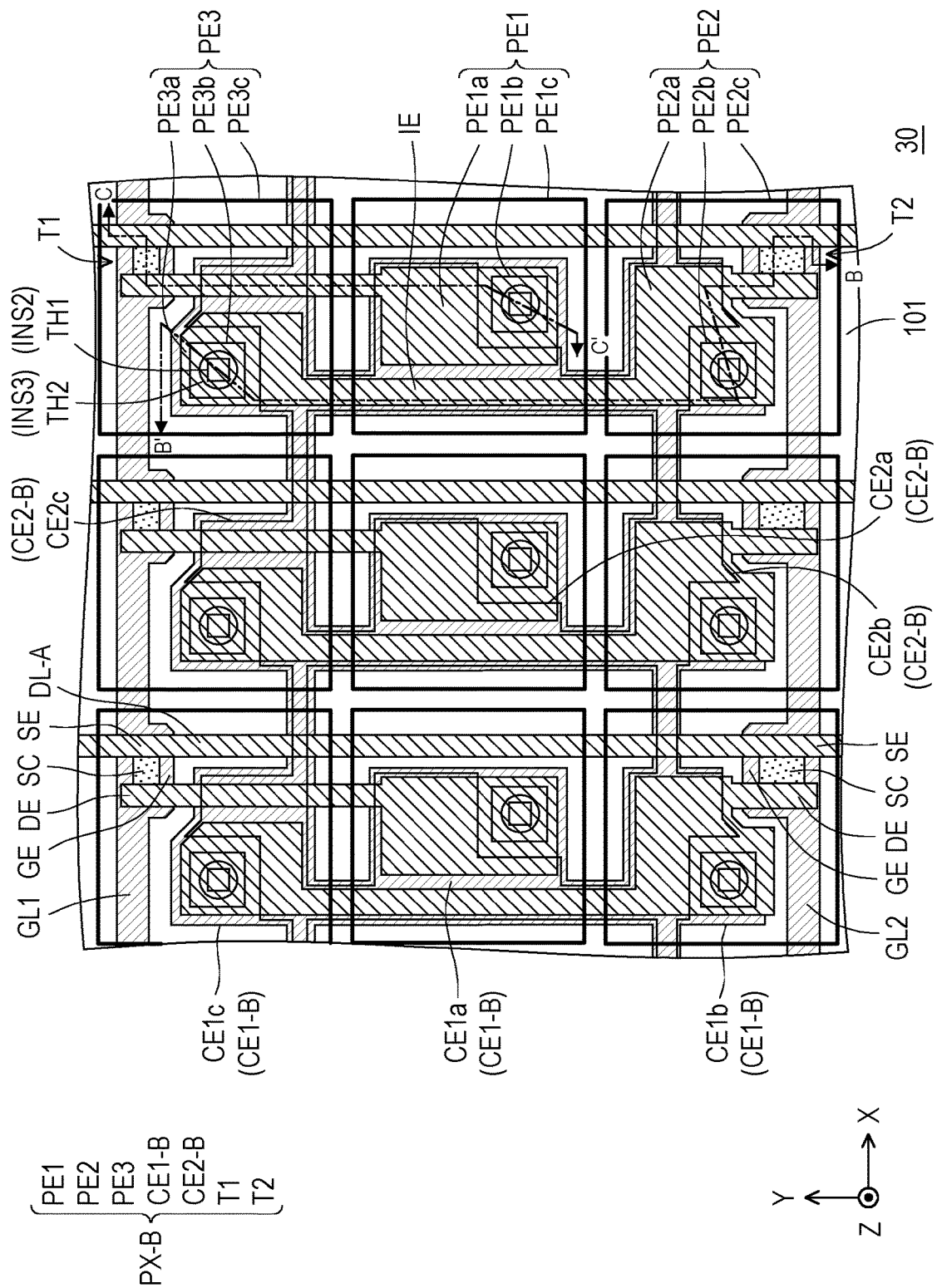
FIG. 9 is a schematic top view of a display panel according to the fifth embodiment of the disclosure.
Figure 10A:
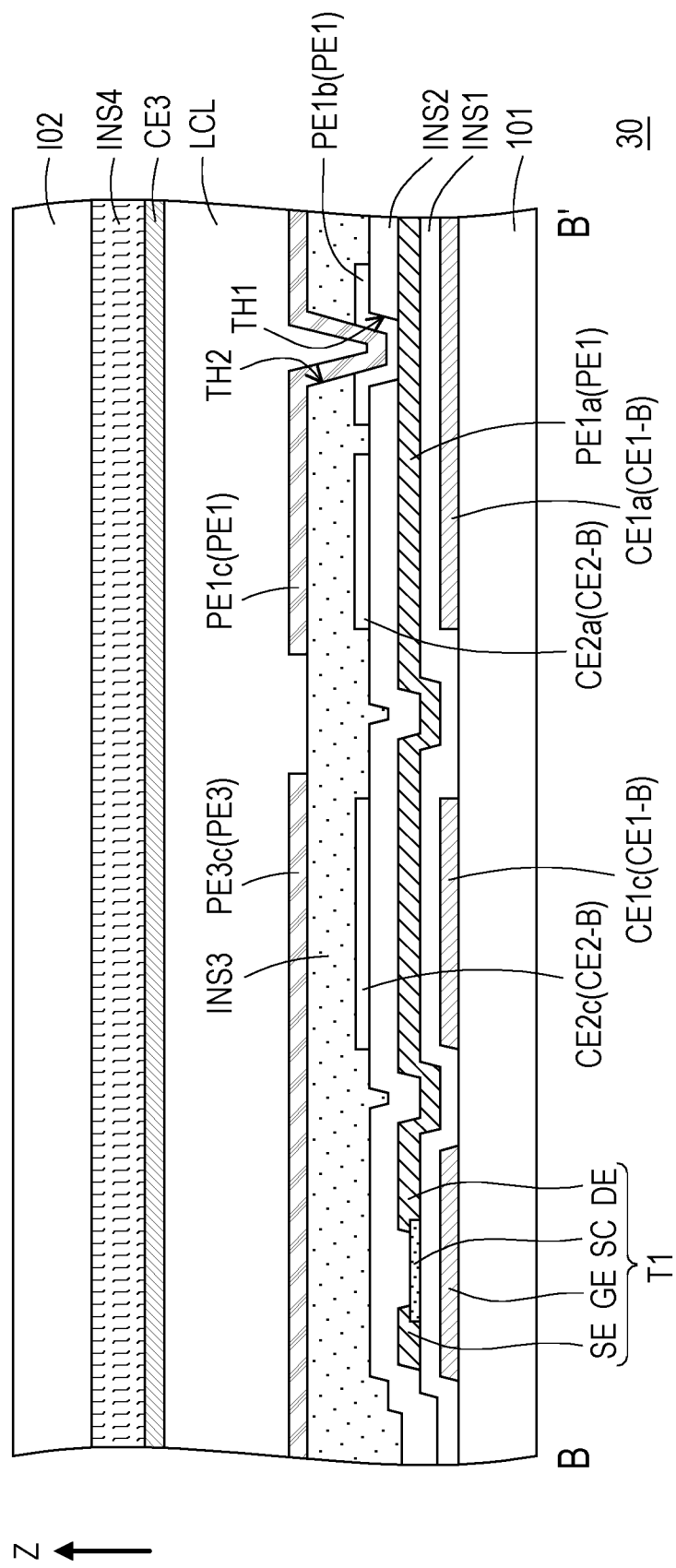
FIG. 10A is a schematic cross-sectional view of the display panel of FIG. 9 taken along a section line B-B'.
Figure 10B:
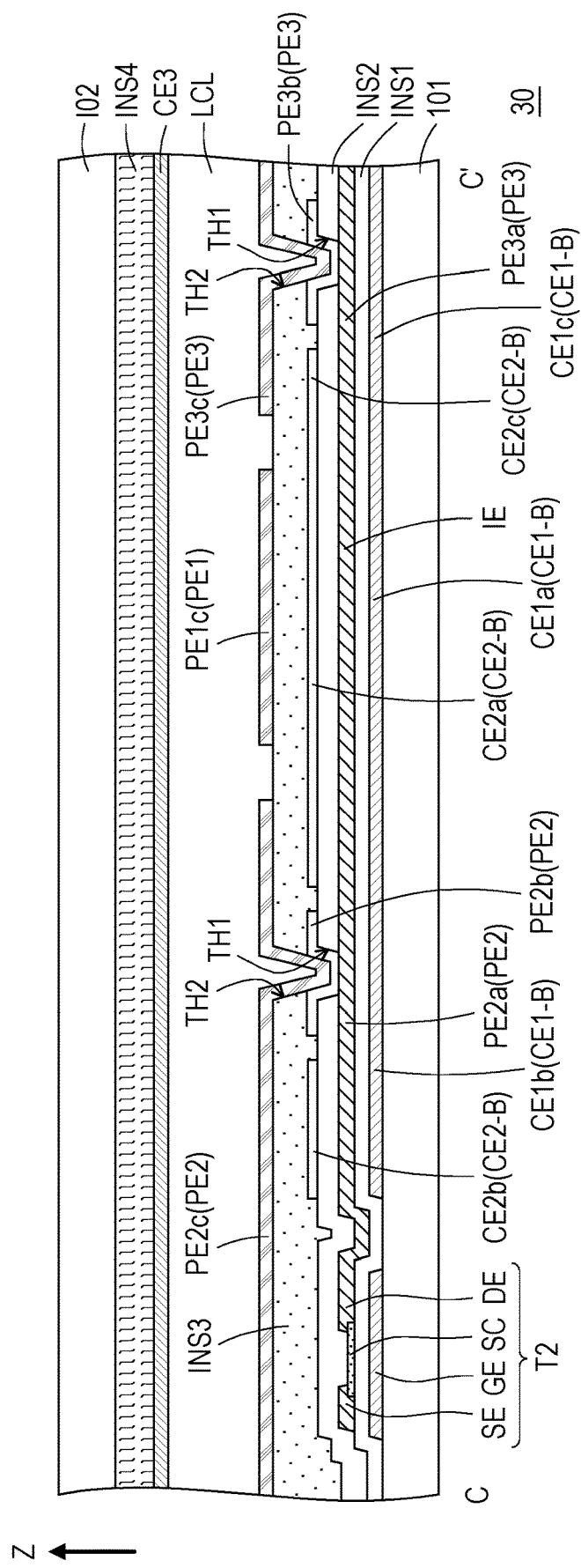
FIG. 10B is a schematic cross-sectional view of the display panel of FIG. 9 taken along a section line C-C'.
Figure 11A:
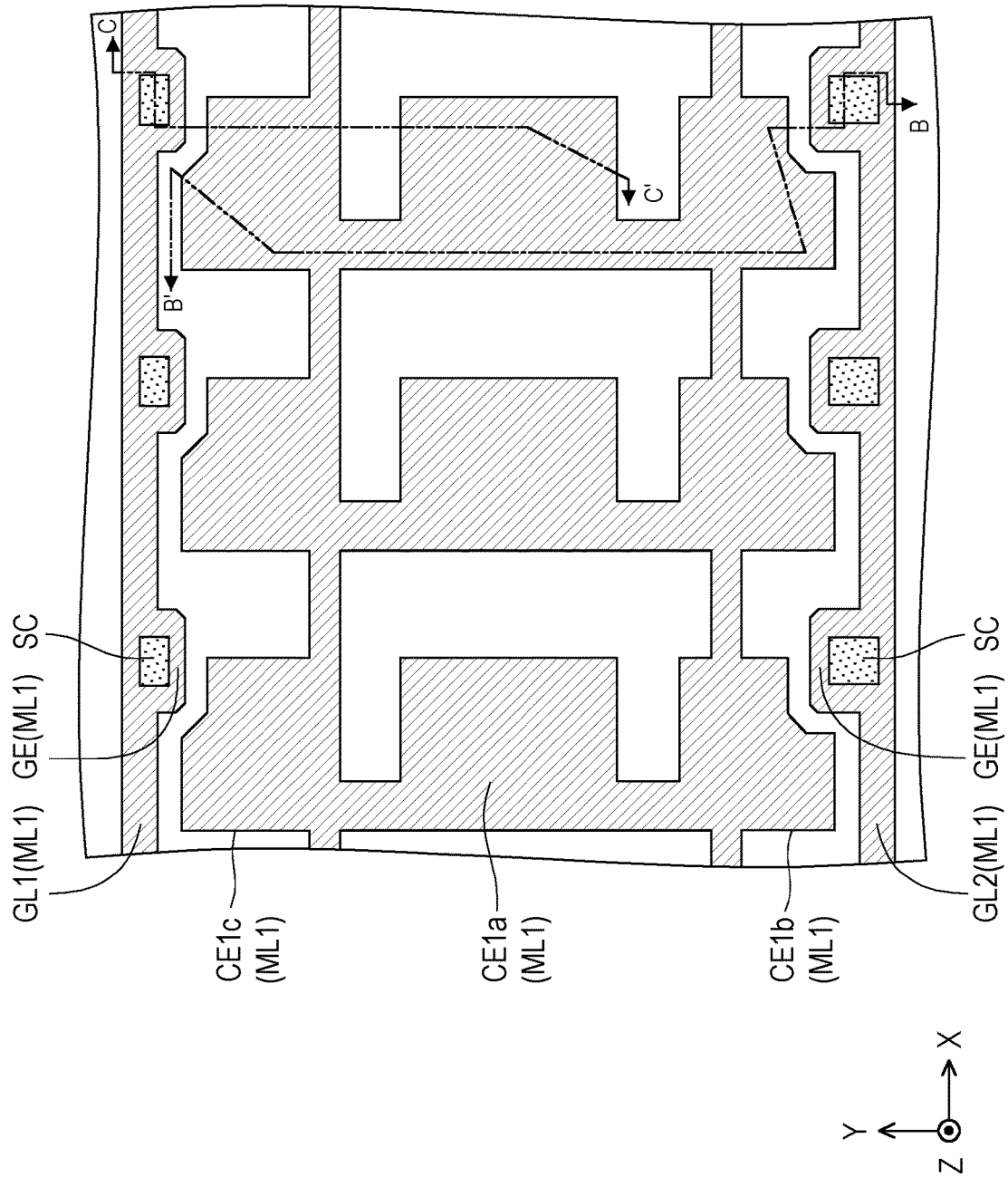
FIGS. 11A to 11D are schematic top views of each of film layers of the display panel of FIG. 9.
Figure 11B:
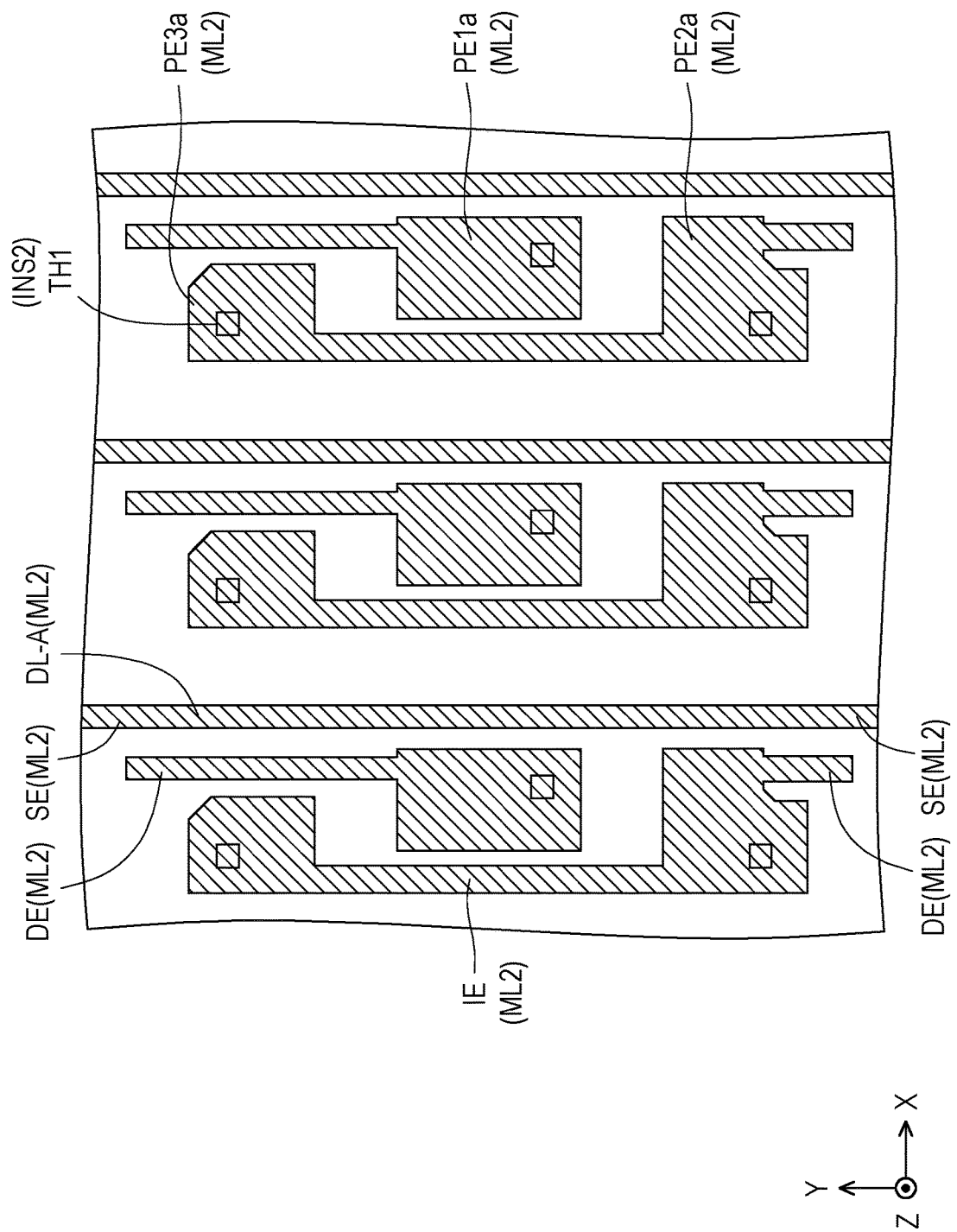
Figure 11C:
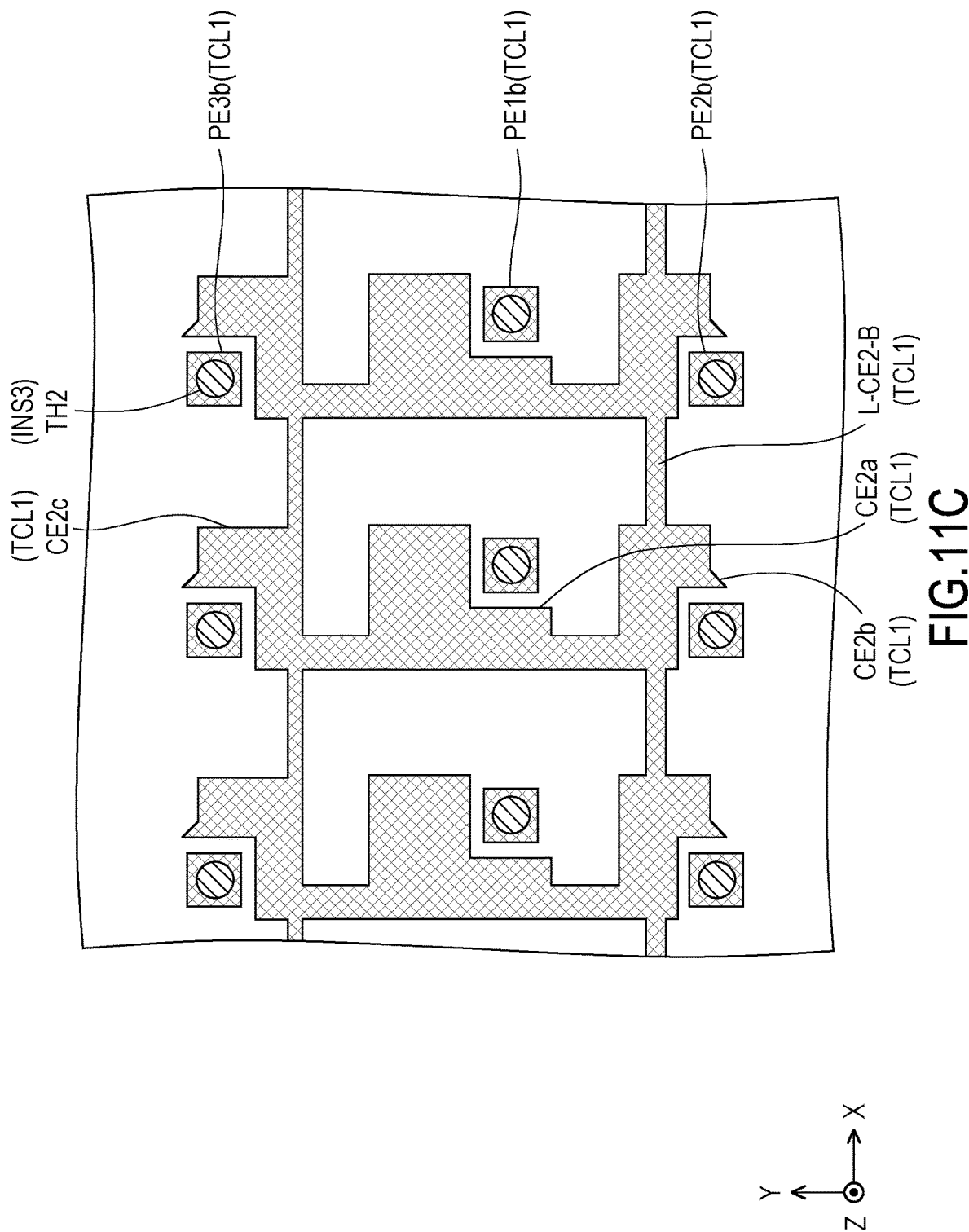
Figure 11D:
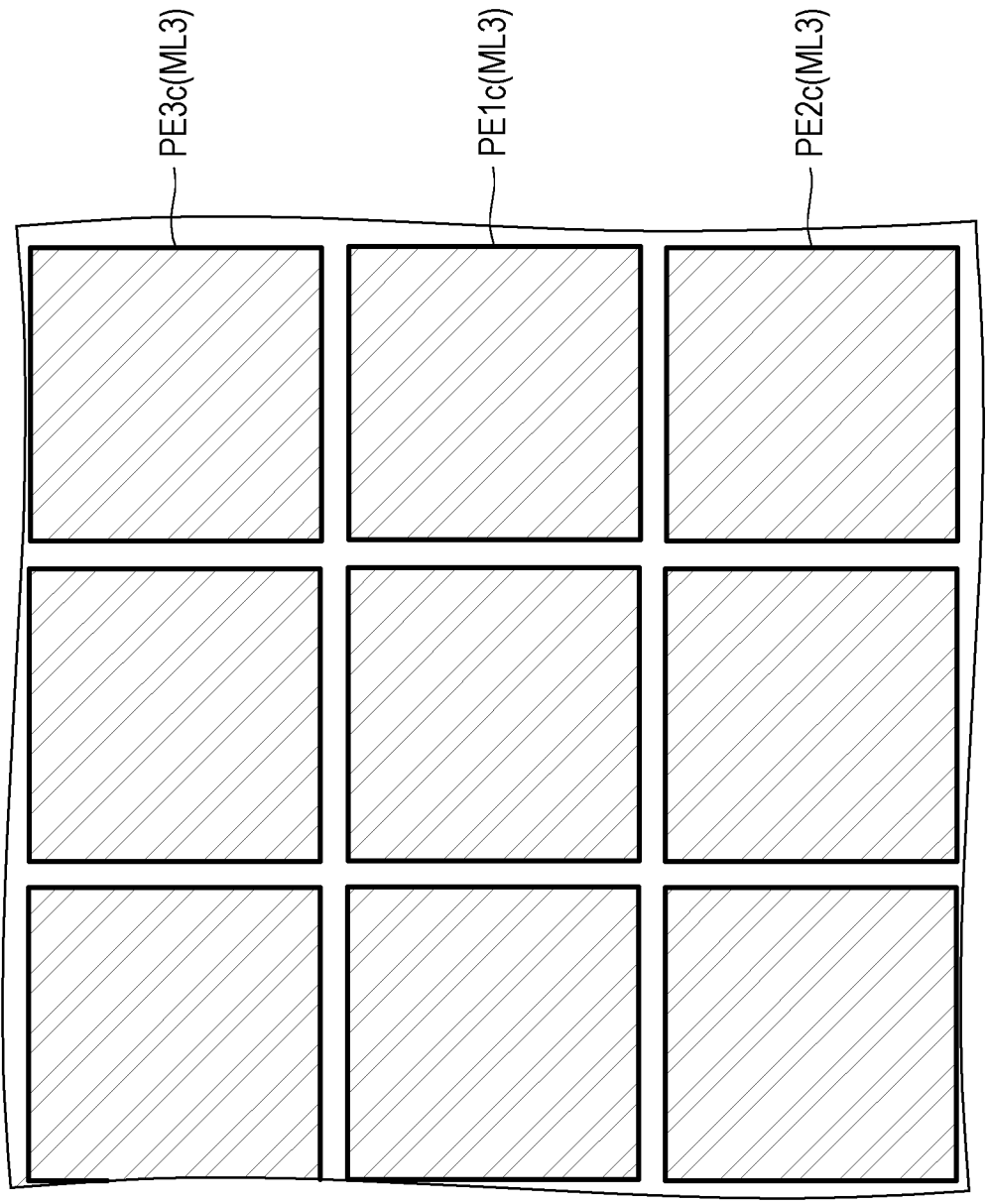

FIG. 9 is a schematic top view of a display panel according to the fifth embodiment of the disclosure. FIGS. 10A and 10B are respectively schematic cross-sectional views of the display panel of FIG. 9 taken along a section line B-B' and a section line C-C'. FIGS. 11A to 11D are schematic top views of each of film layers of the display panel of FIG. 9. FIG. 11A is a schematic top view of the first metal layer ML1 and the semiconductor pattern SC of the display panel of FIG. 9. FIG. 11B is a schematic top view of the second metal layer ML2 and the first opening hole TH1. FIG. 11C is a schematic top view of the first transparent conductive layer TCL1 and the second opening hole TH2. FIG. 11D is a schematic top view of the third metal layer ML3. Referring to FIGS. 9, 10A, 10B, and 11A to 11D, a difference between a display panel 30 in this embodiment and the display panel 10 in FIG. 1 is that in order to increase the number of gray levels of a display pixel, a pixel structure PX-B of the display panel 30 has three pixel electrodes and two active elements, which are respectively a first pixel electrode PE1, a second pixel electrode PE2, a third pixel electrode PE3, a first active element T1, and a second active element T2. In this embodiment, the first pixel electrode PE1 is electrically connected to a corresponding data line DL-A and a first scan line GL1 through the first active element T1. The second pixel electrode PE2 and the third pixel electrode PE3 are electrically connected to the one corresponding data line DL-A and a second scan line GL2 through the second active element T2. Since the first active element T1 and the second active element T2 in this embodiment are similar to the active element T in FIG. 1, detailed descriptions may refer to the relevant paragraphs of the foregoing embodiment, and the same details will not be repeated in the following.

In this embodiment, the pixel structure PX-B has a display area, which includes an area corresponding to the first pixel electrode PE1 and an area corresponding to the second pixel electrode PE2 and the third pixel electrode PE3. The area corresponding to the first pixel electrode PE1 in the pixel structure PX-B may be called a first sub-display area of the pixel structure PX-B, and the area corresponding to the second pixel electrode PE2 and the third pixel electrode PE3 in the pixel structure PX-B may be called a second sub-display area of the pixel structure PX-B. An area of the second sub-display area is twice that of the first sub-display area. The first active element T1 is coupled to the first pixel electrode PE1, and the second active element T2 is coupled to the second pixel electrode PE2 and the third pixel electrode PE3. The first active element T1 and the second active element T2 are coupled to the same data line DL-A, and the first active element T1 and the second active element T2 are respectively coupled to the first scan line GL1 and the second scan line GL2. Therefore, the first active element T1 and the second active element T2 may be controlled to be both on, one on and the other off, or both off, and a corresponding data signal is input from the data line DL-A, so that the first sub-display area and the second sub-display area are both in a dark state (that is, the display area of the pixel structure PX-B are all in the dark state), respectively in a bright state and the dark state (that is, one-third of the display area of the pixel structure PX-B is in the bright state), respectively in the dark state and the bright state (that is, two-thirds of the display area of the pixel structure PX-B is in the bright state), or both in the bright state (that is, the display area of the pixel structure PX-B is all in the bright state). That is, the pixel structure PX-B may be modulated in four grayscales. If the three pixel structures PX-B in FIG. 9 are sub-pixels that display different colors, for example, a red sub-pixel, a green sub-pixel, and a blue sub-pixel, a pixel formed by the three sub-pixels of different colors may be modulated with 64 colors since each of the sub-pixels may be modulated in the four grayscales.

It is particularly noted that a first common electrode CE1-B and a second common electrode CE2-B each overlap the first pixel electrode PE1, the second pixel electrode PE2, and the third pixel electrode PE3. In detail, the first common electrode CE1-B includes a first sub-common electrode CE1a, a second sub-common electrode CE1b, and a third sub-common electrode CE1c that are electrically connected to one another, and the first sub-common electrode CE1a, the second sub-common electrode CE1b, and the third sub-common electrode CE1c respectively overlap the first pixel electrode PE1, the second pixel electrode PE2, and the third pixel electrode PE3. Similarly, the second common electrode CE2-B includes a first sub-common electrode CE2a, a second sub-common electrode CE2b, and a third sub-common electrode CE2c that are electrically connected to one another, and the first sub-common electrode CE2a, the second sub-common electrode CE2b, and the third sub-common electrode CE2c respectively overlap the first pixel electrode PE1, the second pixel electrode PE2, and the third pixel electrode PE3.

From another point of view, the first scan line GL1 and the second scan line GL2 each extend toward the direction X, and the first pixel electrode PE1 is disposed between the second pixel electrode PE2 and the third pixel electrode PE3 in the direction Y. The first sub-common electrode CE1a of the first common electrode CE1-B is disposed between the second sub-common electrode CE1b and the third sub-common electrode CE1c in the direction Y. The first sub-common electrode CE2a of the second common electrode CE2-B is disposed between the second sub-common electrode CE2b and the third sub-common electrode CE2c in the direction Y. The stacking relationship between each of the pixel electrodes and the respective sub-common electrodes of the corresponding two common electrodes is similar to that of the pixel structure PX of the display panel 10 in FIG. 2. Therefore, detailed descriptions may refer to the relevant paragraphs of the foregoing embodiment, and the same details will not be repeated in the following.

In this embodiment, a first sub-electrode PE2a of the second pixel electrode PE2 is electrically connected to a first sub-electrode PE3a of the third pixel electrode PE3 through a connecting electrode IE, and is electrically insulated from a first sub-electrode PE1a of the first pixel electrode PE1. For example, the connecting electrode IE may extend toward the direction Y, and the connecting electrode IE, the first sub-electrode PE2a of the second pixel electrode PE2, and the first sub-electrode PE3a of the third pixel electrode PE3 may be the same film layer. However, the disclosure is not limited thereto. It is particularly noted that the connecting electrode IE overlaps the first sub-common electrode CE1a of the first common electrode CE1-B and the first sub-common electrode CE2a of the second common electrode CE2-B. Accordingly, the total capacitance of the storage capacitor connecting the second pixel electrode PE2 and the third pixel electrode PE3 may be further increased. On the other hand, a third sub-electrode PE1c of the first pixel electrode PE1 overlaps and covers the connecting electrode IE, so that an electric field of the connecting electrode IE may be prevented from coupling with an electric field of the third common electrode (not shown) on the second substrate (not shown) to affect the driving of the liquid crystal layer LCL.

In this embodiment, areas of the third sub-electrode PE1c of the first pixel electrode PE1, a third sub-electrode PE2c of the second pixel electrode PE2, and a third sub-electrode PE3c of the third pixel electrode PE3 may be the same as one another, but the disclosure is not limited thereto. As mentioned before, the area corresponding to the first pixel electrode PE1 in the pixel structure PX-B is the first sub-display area of the pixel structure PX-B, and the area corresponding to the second pixel electrode PE2 and the third pixel electrode PE3 in the pixel structure PX-B is the second sub-display area of the pixel structure PX-B. Since the areas of the third sub-electrode PE1c of the first pixel electrode PE1, a third sub-electrode PE2c of the second pixel electrode PE2, and a third sub-electrode PE3c of the third pixel electrode PE3 may be the same as one another, the area of the second sub-display area in this embodiment may be twice that of the first sub-display area, but the disclosure is not limited thereto. In this embodiment, the connection and disposition relationship of the three sub-electrodes of each of the pixel electrodes is similar to that of the pixel electrode PE of the display panel 10 in FIG. 1. For example, the third sub-electrode PE1c of the first pixel electrode PE1 is electrically connected to the first sub-electrode PE1a through a second sub-electrode PE1b. The third sub-electrode PE2c of the second pixel electrode PE2 is electrically connected to the first sub-electrode PE2a through a second sub-electrode PE2b. The third sub-electrode PE3c of the third pixel electrode PE3 is electrically connected to the first sub-electrode PE3a through a second sub-electrode PE3b.

The first metal layer ML1 includes the gate GE of the first active element T1 and the gate GE of the second active element T2, the first scan line GL1, the second scan line GL2, and the first common electrode CE1-B.

The second metal layer ML2 includes the data line DL-A, the drain DE and the source SE of the first active element T1, the drain DE and the source SE of the second active element T2, the first sub-electrode PE1a of the first pixel electrode PE1, the first sub-electrode PE2a of the second pixel electrode PE2, the first sub-electrode PE3a of the third pixel electrode PE3, and the connecting electrode IE, and the first sub-common electrode CE1a, the second sub-common electrode CE1b, and the third sub-common electrode CE1c of the first common electrode CE1-B respectively overlap the first sub-electrode PE1a, the first sub-electrode PE2a, and the first sub-electrode PE3a.

The three first opening holes TH1 of the second insulation layer INS2 in each of the pixel structures PX-B respectively expose a part of the first sub-electrode PE1a, a part of the first sub-electrode PE2a, and a part of the first sub-electrode PE3a.

The first transparent conductive layer TCL1 includes the second common electrode CE2-B, the second sub-electrode PE1b of the first pixel electrode PE1, the second sub-electrode PE2b of the second pixel electrode PE2, the second sub-electrode PE3b of the third pixel electrode PE3, and a connecting line L-CE2-B. The first sub-common electrode CE2a, the second sub-common electrode CE2b, and the third sub-common electrode CE2c of the second common electrode CE2-B respectively overlap the first sub-electrode PE1a, the first sub-electrode PE2a, and the first sub-electrode PE3a, and the second sub-electrode PE1b, the second sub-electrode PE2b, and the second sub-electrode PE3b are respectively electrically connected to the first sub-electrode PE1a, the first sub-electrode PE2a, and the first sub-electrode PE3a respectively through the corresponding first opening holes TH1. The second common electrodes CE2-B of the two pixel structures PX-B adjacent to each other along the direction X are electrically connected to each other through the connecting line L-CE2-B extending along the direction X.

The three second opening holes TH2 of the third insulation layers INS3 in each of the pixel structures PX-B respectively expose at least a part of the second sub-electrode PE1b, at least a part of the second sub-electrode PE2b, and at least a part of the second sub-electrode PE3b.

The third metal layer ML3 includes the third sub-electrode PE1c of the first pixel electrode PE1, the third sub-electrode PE2c of the second pixel electrode PE2, and the third sub-electrode PE3c of the third pixel electrode PE3. The first sub-common electrode CE2a, the second sub-common electrode CE2b, and the third sub-common electrode CE2c of the second common electrode CE2-B respectively overlap the third sub-electrode PE1c, the third sub-electrode PE2c, and the third sub-electrode PE3c, and the third sub-electrode PE1c, the third sub-electrode PE2c, and the third sub-electrode PE3c are respectively electrically connected to the second sub-electrode PE1b, the second sub-electrode PE2b, and the second sub-electrode PE3b respectively through the corresponding second opening holes TH2.

A process of a manufacturing method of the display panel 30 in this embodiment is similar to that of FIGS. 3A to 3I in the first embodiment, and thus the same details will not be repeated in the following.

A storage capacitance between the sub-electrodes of the first pixel electrode PE1, the second pixel electrode PE2, and the third pixel electrode PE3 and the two common electrodes is relatively large. Therefore, a voltage holding ratio of the pixel structure PX-B may be increased, thereby improving the display quality of the display panel 30 during the low-frequency operation. Especially when a size of the pixel structure PX-B is reduced to meet the demand for the high-resolution display screen, the above disposition of the storage capacitors may more significantly improve the display quality during the low-frequency operation.

On the other hand, the first common electrode CE1-B, the gate GE of the first active element T1, and the gate GE of the second active element T2 are the same film layer, and are electrically insulated from one another. The second common electrode CE2-B, the second sub-electrode PE1*b* of the first pixel electrode PE1, the second sub-electrode PE2*b* of the second pixel electrode PE2, and the second sub-electrode PE3*b* of the third pixel electrode PE3 are the same film layer, and are electrically insulated from one another. In other words, the two common electrodes of the pixel structure PX-B in the disclosure are highly integrated with the current panel manufacturing process. Therefore, without adding the additional manufacturing processes, the display panel 30 in the disclosure may have both cost advantages and better display quality during the low-frequency operation.

Figure 12:
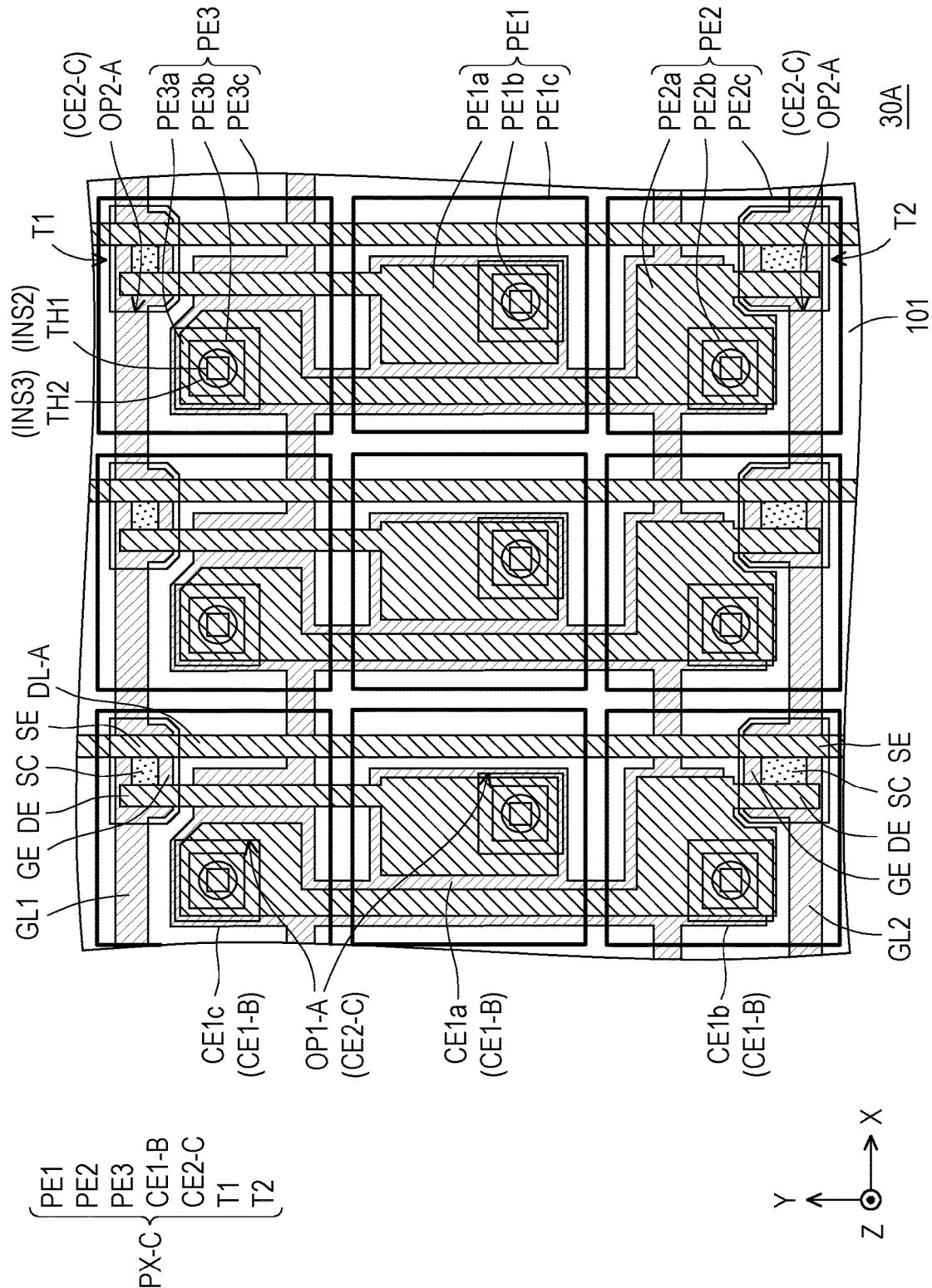
FIG. 12 is a schematic top view of a display panel according to the sixth embodiment of the disclosure.
Figure 13:
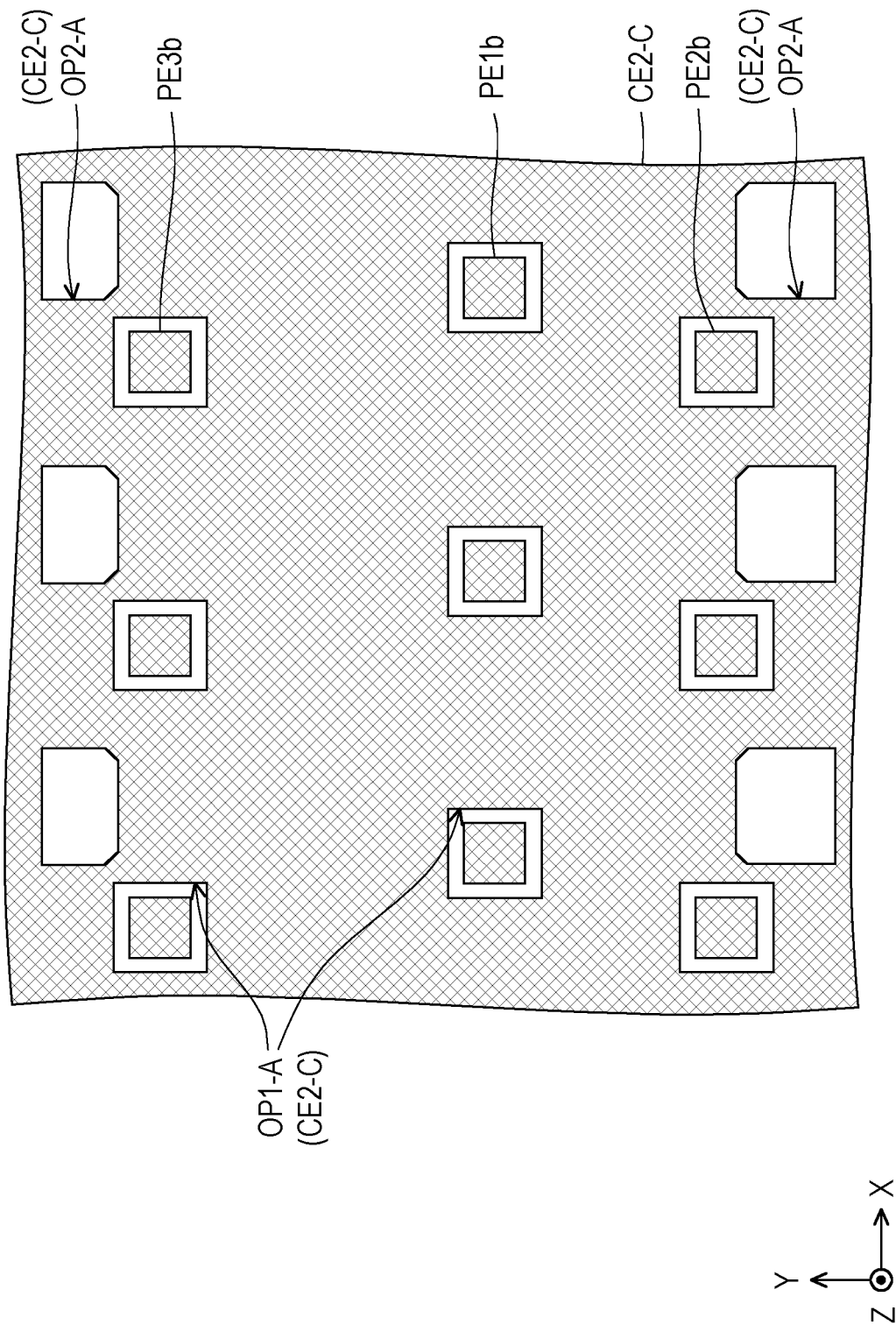
FIG. 13 is a schematic top view of a second common electrode of the display panel of FIG. 12.

FIG. 12 is a schematic top view of a display panel according to the sixth embodiment of the disclosure. FIG. 13 is a schematic top view of a second common electrode of the display panel of FIG. 12. Referring to FIGS. 12 and 13, a difference between a display panel 30A in this embodiment and the display panel 30 in FIG. 9 is that a disposition of the second common electrode is different. Referring to FIGS. 9, 11C, 12, and 13 together, as shown in FIGS. 9 and 11C, each of the pixel structures PX-B of the display panel 30 includes the second common electrode CE2-B. The second common electrode CE2-B does not overlap the active element T, the scan line GL, and the data line DL. The second common electrodes CE2-B of the two pixel structures PX-B adjacent to each other along the direction X are electrically connected to each other through the connecting line L-CE2-B extending along the direction X, and the connecting line L-CE2-B intersects and overlaps a part of the data line DL-A between the two adjacent pixel structures PX-B. On the other hand, as shown in FIGS. 12 and 13, in this embodiment, each of pixel structures PX-C of the display panel 30A includes a second common electrode CE2-C. The second common electrode CE2-C has multiple first openings OP1-A respectively overlapping the second sub-electrodes PE1*b*, PE2*b*, and PE3*b*, and multiple second openings OP2-A respectively overlapping the first active element T1 and the second active element T2, and the second common electrode CE2-C overlaps the scan lines (for example, the scan line GL1 and the scan line GL2) and the data lines DL-A of the display panel 30A. More specifically, the second common electrodes CE2-C are substantially disposed on the entire surface of the second insulation layer INS2 in a display area of the display panel 30A, and have the first openings OP1-A and the second openings OP2-A. The first openings OP1-A are respectively overlap the second sub-electrodes PE1*b* of the first pixel electrodes PE1, the second sub-electrodes PE2*b* of the second pixel electrodes PE2, and the second sub-electrodes PE3*b* of the third pixel electrodes PE3 of the pixel structures PX-C. The second openings OP2-A respectively overlap the first active elements T1 and the second active elements T2 of the pixel structures PX-C.

Based on the above, in the display panel according to the embodiments of the disclosure, the pixel electrode of the pixel structure has the three sub-electrodes electrically connected to one another. The sub-electrodes belong to different film layers, and the two common electrodes are disposed between the sub-electrodes. The storage capacitor formed by the common electrodes and the sub-electrodes has the relatively large storage capacitance. Accordingly, the voltage holding ratio of the pixel structure may be effectively increased, thereby improving the display quality of the display panel during the low-frequency operation. On the other hand, one of the two common electrodes and one of the sub-electrodes are formed on the same film layer. Therefore, the integration with the current display panel manufacturing process is also high. In other words, without adding the additional manufacturing processes, the display panel in the disclosure may have both better display quality and cost advantages.

Lastly, it is to be noted that the embodiments described above are only used to illustrate the technical solutions of the disclosure, and not to limit the disclosure. Although the disclosure is described in detail with reference to the embodiments, those skilled in the art should understand that it is still possible to modify the technical solutions recorded in the embodiments, or to equivalently replace some or all of the technical features. The modifications or replacements do not cause the essence of the corresponding technical solutions to deviate from the scope of the technical solutions of the embodiments.

What is claimed is:

1. A display panel, comprising:
   a first substrate;
   a plurality of scan lines and a plurality of data lines disposed on the first substrate, wherein the plurality of scan lines intersect the plurality of data lines to define a plurality of pixel areas; and
   a plurality of pixel structures disposed in the plurality of pixel areas and electrically connected to the plurality of data lines and the plurality of scan lines, wherein each of the plurality of pixel structures comprises:
   at least one active element;
   at least one pixel electrode, comprising:
      a first sub-electrode electrically connected to a corresponding one of the at least one active element;
      a second sub-electrode electrically connected to the first sub-electrode; and
      a third sub-electrode electrically connected to the second sub-electrode, wherein the first sub-electrode, the second sub-electrode, and the third sub-electrode are different film layers;
   a first common electrode disposed between the first sub-electrode and the first substrate and overlapping the first sub-electrode; and
   a second common electrode disposed between the first sub-electrode and the third sub-electrode and overlapping the first sub-electrode and the third sub-electrode, wherein the second sub-electrode and the second common electrode are the same film layers, and are electrically insulated from each other, and the second common electrode has a first opening overlapping the second sub-electrode of the at least one pixel electrode and a second opening overlapping the at least one active element.

2. The display panel according to claim 1, further comprising:
   a first insulation layer disposed between the first sub-electrode and the first common electrode, wherein the first sub-electrode, at least a part of the first insulation layer, and the first common electrode form a first storage capacitor.

3. The display panel according to claim 1, further comprising:
   a second insulation layer disposed between the first sub-electrode and the second common electrode, wherein the first sub-electrode, at least a part of the second insulation layer, and the second common electrode form a second storage capacitor.

4. The display panel according to claim 3, wherein the second insulation layer has a first opening hole overlapping the first sub-electrode, the second sub-electrode is disposed on the second insulation layer, and a part of the second sub-electrode extends into the first opening hole and covers a surface of the first sub-electrode exposed by the first opening hole.

5. The display panel according to claim 4, further comprising:
a third insulation layer disposed between the second common electrode and the third sub-electrode, wherein the third sub-electrode, at least a part of the third insulation layer, and the second common electrode form a third storage capacitor.

6. The display panel according to claim 5, wherein the third insulation layer has a second opening hole overlapping the first opening hole, and the third sub-electrode is disposed on the third insulation layer, and is electrically connected to the second sub-electrode through the second opening hole.

7. The display panel according to claim 1, wherein the second common electrodes of two adjacent pixel structures of the plurality of pixel structures are electrically connected to each other through a connecting line, and the connecting line overlaps a part of one of the plurality of data lines disposed between the two adjacent pixel structures.

8. The display panel according to claim 1, wherein the second common electrodes of the plurality of pixel structures are electrically connected to each other and overlap the plurality of scan lines and the plurality of data lines.

9. The display panel according to claim 1, further comprising:
a second substrate disposed opposite to the first substrate;
a third common electrode disposed on a surface of the second substrate facing the first substrate; and
a liquid crystal layer disposed between the third sub-electrode and the second substrate, wherein the third sub-electrode is a reflective electrode.

10. A display panel, comprising:
a first substrate;
a plurality of scan lines and a plurality of data lines disposed on the first substrate, wherein the plurality of scan lines intersect the plurality of data lines to define a plurality of pixel areas; and
a plurality of pixel structures disposed in the plurality of pixel areas and electrically connected to the plurality of data lines and the plurality of scan lines, wherein each of the plurality of pixel structures comprises:
at least one active element;
at least one pixel electrode, comprising:
a first sub-electrode electrically connected to a corresponding one of the at least one active element;
a second sub-electrode electrically connected to the first sub-electrode; and
a third sub-electrode electrically connected to the second sub-electrode, wherein the first sub-electrode, the second sub-electrode, and the third sub-electrode are different film layers;
a first common electrode disposed between the first sub-electrode and the first substrate and overlapping the first sub-electrode; and
a second common electrode disposed between the first sub-electrode and the third sub-electrode and overlapping the first sub-electrode and the third sub-electrode, wherein the second sub-electrode and the second common electrode are the same film layers, and are electrically insulated from each other, and the third sub-electrode of the at least one pixel electrode covers the at least one active element, one of the plurality of data lines, and one of the plurality of scan lines.

11. A display panel, comprising:
a first substrate;
a plurality of scan lines and a plurality of data lines disposed on the first substrate, wherein the plurality of scan lines intersect the plurality of data lines to define a plurality of pixel areas; and
a plurality of pixel structures disposed in the plurality of pixel areas and electrically connected to the plurality of data lines and the plurality of scan lines, wherein each of the plurality of pixel structures comprises:
at least one active element;
at least one pixel electrode, comprising:
a first sub-electrode electrically connected to a corresponding one of the at least one active element;
a second sub-electrode electrically connected to the first sub-electrode; and
a third sub-electrode electrically connected to the second sub-electrode, wherein the first sub-electrode, the second sub-electrode, and the third sub-electrode are different film layers;
a first common electrode disposed between the first sub-electrode and the first substrate and overlapping the first sub-electrode; and
a second common electrode disposed between the first sub-electrode and the third sub-electrode and overlapping the first sub-electrode and the third sub-electrode, wherein the second sub-electrode and the second common electrode are the same film layers, and are electrically insulated from each other, the at least one pixel electrode comprises a first pixel electrode, a second pixel electrode, and a third pixel electrode, the second pixel electrode and the third pixel electrode are electrically connected to each other, the at least one active element comprises a first active element and a second active element, the plurality of scan lines comprise a first scan line and a second scan line, the first active element is electrically connected to one of the plurality of data lines, the first pixel electrode, and the first scan line, the second active element is electrically connected to the one of the plurality of data lines, the second pixel electrode, the third pixel electrode, and the second scan line, and the first common electrode and the second common electrode each overlap the first pixel electrode, the second pixel electrode, and the third pixel electrode.

12. The display panel according to claim 11, wherein the first common electrode and the second common electrode each comprise a first sub-common electrode, a second sub-common electrode, and a third sub-common electrode, the first sub-common electrode, the second sub-common electrode, and the third sub-common electrode of the first common electrode are electrically connected to one another and respectively overlap the first sub-electrode of the first pixel electrode, the first sub-electrode of the second pixel electrode, and the first sub-electrode of the third pixel electrode, the first sub-common electrode, the second sub-common electrode, and the third sub-common electrode of the second common electrode are electrically connected to one another and respectively overlap the first sub-electrode of the first pixel electrode, the first sub-electrode of the second pixel electrode, and the first sub-electrode of the third pixel electrode, and the first sub-common electrode, the second sub-common electrode, and the third sub-common electrode of the second common electrode respectively overlap the third sub-electrode of the first pixel electrode, the third sub-electrode of the second pixel electrode, and the third sub-electrode of the third pixel electrode.

13. The display panel according to claim 12, wherein the one of the plurality of data lines extends along a direction, the first pixel electrode is disposed between the second pixel electrode and the third pixel electrode in the direction, the first sub-common electrode of the first common electrode is disposed between the second sub-common electrode and the third sub-common electrode of the first common electrode in the direction, and the first sub-common electrode of the second common electrode is disposed between the second sub-common electrode and the third sub-common electrode of the second common electrode in the direction.

14. The display panel according to claim 13, wherein the first sub-electrode of the second pixel electrode is electrically connected to the first sub-electrode of the third pixel electrode through a connecting electrode, and the connecting electrode extends along the direction.

15. The display panel according to claim 14, wherein the connecting electrode, the first sub-electrode of the second pixel electrode, and the first sub-electrode of the third pixel electrode are the same film layer, the connecting electrode overlaps the first sub-common electrode of the first common electrode and the first sub-common electrode of the second common electrode, and the third sub-electrode of the first pixel electrode overlaps and covers the connecting electrode.

16. The display panel according to claim 11, wherein areas of the third sub-electrode of the first pixel electrode, the third sub-electrode of the second pixel electrode, and the third sub-electrode of the third pixel electrode are the same as one another.

17. A manufacturing method of a display panel, comprising:
   forming a first metal layer on a first substrate, wherein the first metal layer comprises a scan line and a first common electrode;
   forming a first insulation layer on the first metal layer;
   forming a second metal layer on the first insulation layer, wherein the second metal layer comprises a data line, a drain and a source of an active element, and a first sub-electrode of a pixel electrode, and the first sub-electrode overlaps the first common electrode;
   forming a second insulation layer on the second metal layer;
   forming a first opening hole in the second insulation layer, wherein the first opening hole exposes a part of the first sub-electrode;
   forming a first transparent conductive layer on the second insulation layer, wherein the first transparent conductive layer comprises a second common electrode and a second sub-electrode of the pixel electrode, the second common electrode overlaps the first sub-electrode, and the second sub-electrode is electrically connected to the first sub-electrode through the first opening hole;
   forming a third insulation layer on the first transparent conductive layer;
   forming a second opening hole in the third insulation layer, wherein the second opening hole exposes at least a part of the second sub-electrode; and
   forming a third metal layer on the third insulation layer, wherein the third metal layer comprises a third sub-electrode of the pixel electrode, the second common electrode overlaps the third sub-electrode, the third sub-electrode is electrically connected to the second sub-electrode through the second opening hole, and the second common electrode has a first opening overlapping the second sub-electrode of the pixel electrode and a second opening overlapping the active element.

18. The manufacturing method according to claim 17, further comprising:
   forming a second transparent conductive layer on a second substrate, wherein the second transparent conductive layer comprises a third common electrode; and
   assembling the first substrate and the second substrate, wherein the first substrate and the second substrate are disposed opposite to each other, and a liquid crystal layer is disposed between the first substrate and the second substrate.

* * * * *